(12) United States Patent
Honda et al.

(10) Patent No.: US 8,835,921 B2
(45) Date of Patent: *Sep. 16, 2014

(54) OXIDE SEMICONDUCTOR FILM AND SEMICONDUCTOR DEVICE

(71) Applicant: Semiconductor Energy Laboratory Co. Ltd., Atsugi (JP)

(72) Inventors: Tatsuya Honda, Isehara (JP); Hiroshi Kanemura, Tochigi (JP); Kengo Akimoto, Atsugi (JP); Suzunosuke Hiraishi, Tochigi (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 0 days.

This patent is subject to a terminal disclaimer.

(21) Appl. No.: 14/191,714

(22) Filed: Feb. 27, 2014

(65) Prior Publication Data

US 2014/0175438 A1 Jun. 26, 2014

Related U.S. Application Data

(63) Continuation of application No. 13/421,038, filed on Mar. 15, 2012, now Pat. No. 8,686,416.

(30) Foreign Application Priority Data

Mar. 25, 2011 (JP) .................. 2011-068436

(51) Int. Cl.
*H01L 29/38* (2006.01)
*H01L 29/786* (2006.01)
*H01L 29/04* (2006.01)
*H01L 29/24* (2006.01)

(52) U.S. Cl.
USPC .................. 257/43; 257/E29.296

(58) Field of Classification Search
USPC .............. 257/43, E29.296, E21.461; 438/104
See application file for complete search history.

(56) References Cited

U.S. PATENT DOCUMENTS

| 5,731,856 | A | 3/1998 | Kim et al. |
| 5,744,864 | A | 4/1998 | Cillessen et al. |

(Continued)

FOREIGN PATENT DOCUMENTS

| EP | 1 737 044 A | 12/2006 |
| EP | 2 226 847 A | 9/2010 |

(Continued)

OTHER PUBLICATIONS

Kamiya et al., "Carrier Transport Properties and Electronic Structures of Amorphous Oxide Semiconductors: the present status," Kotai Butsuri (Solid State Physics), Sep. 1, 2009, vol. 44, No. 9, pp. 621-633, Agne Gijutsu Center.

(Continued)

*Primary Examiner* — Daniel Shook
(74) *Attorney, Agent, or Firm* — Eric J. Robinson; Robinson Intellectual Property Law Office, P.C.

(57) ABSTRACT

Provided is an oxide semiconductor film which has more stable electric characteristics and essentially consists of indium zinc oxide. In addition, provided is a highly reliable semiconductor device which has stable electric characteristics by using the oxide semiconductor film. The oxide semiconductor film essentially consisting of indium zinc oxide has a hexagonal crystal structure in which the a-b plane is substantially parallel to a surface of the oxide semiconductor film and a rhombohedral crystal structure in which the a-b plane is substantially parallel to the surface of the oxide semiconductor film.

17 Claims, 11 Drawing Sheets

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,601,984 B2 | 10/2009 | Sano et al. |
| 7,674,650 B2 | 3/2010 | Akimoto et al. |
| 7,732,819 B2 | 6/2010 | Akimoto et al. |
| 7,791,072 B2 | 9/2010 | Kumomi et al. |
| 8,686,416 B2* | 4/2014 | Honda et al. ............. 257/43 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017244 A1* | 1/2005 | Hoffman et al. ............. 257/72 |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0179199 A1 | 7/2009 | Sano et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0295041 A1 | 11/2010 | Kumomi et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 | 6/2006 |
| JP | 2006-165529 | 6/2006 |
| WO | WO 2004/114391 | 12/2004 |
| WO | WO 2006/051993 | 5/2006 |

OTHER PUBLICATIONS

Fortunato et al., "Wide-Bandgap High-Mobility ZnO Thin-Film Transistors Produced At Room Temperature," Appl. Phys. Lett. (Applied Physics Letters), Sep. 27, 2004, vol. 85, No. 13, pp. 2541-2543.

Dembo et al., "RFCPUS on Glass and Plastic Substrates Fabricated by TFT Transfer Technology," IEDM 05: Technical Digest of International Electron Devices Meeting, Dec. 5, 2005, pp. 1067-1069.

Ikeda et al., "Full-Functional System Liquid Crystal Display Using CG-Silicon Technology," SID Digest '04: SID International Symposium Digest of Technical Papers, 2004, vol. 35, pp. 860-863.

Nomura et al., "Room-Temperature Fabrication of Transparent Flexible Thin-Film Transistors Using Amorphous Oxide Semiconductors," NATURE, Nov. 25, 2004, vol. 432, pp. 488-492.

Park et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Takahashi et al., "Theoretical Analysis of IGZO Transparent Amorphous Oxide Semiconductor," IDW '08: Proceedings of the 15th International Display Workshops, Dec. 3, 2008, pp. 1637-1640.

Hayashi et al., "42.1: Invited Paper: Improved Amorphous In-Ga-Zn-O TFTs," SID Digest '08: SID International Symposium Digest of Technical Papers, May 20, 2008, vol. 39, pp. 621-624.

(56) References Cited

OTHER PUBLICATIONS

Prins et al., "A Ferroelectric Transparent Thin-Film Transistor," Appl. Phys. Lett. (Applied Physics Letters), Jun. 17, 1996, vol. 68, No. 25, pp. 3650-3652.

Nakamura et al., "The Phase Relations in the $In_2O_3$-$Ga_2ZnO_4$-ZnO System at 1350° C.," Journal of Solid State Chemistry, Aug. 1, 1991, vol. 93, No. 2, pp. 298-315.

Kimizuka et al., "Syntheses and Single-Crystal Data of Homologous Compounds, $In_2O_3(ZnO)m$ ($m$ = 3, 4, and 5), $InGaO_3(ZnO)_3$, and $Ga_2O_3(ZnO)m$ ($m$ = 7, 8, 9, and 16) in the $In_2O_3$-$ZnGa_2O_4$-ZnO System," Journal of Solid State Chemistry, Apr. 1, 1995, vol. 116, No. 1, pp. 170-178.

Nomura et al., "Thin-Film Transistor Fabricated in Single-Crystalline Transparent Oxide Semiconductor," Science, May 23, 2003, vol. 300, No. 5623, pp. 1269-1272.

Masuda et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Asakuma et al., "Crystallization and Reduction of Sol-Gel-Derived Zinc Oxide Films by Irradiation with Ultraviolet Lamp," Journal of Sol-Gel Science and Technology, 2003, vol. 26, pp. 181-184.

Osada et al., "15.2: Development of Driver-Integrated Panel using Amorphous In-Ga-Zn-Oxide TFT," SID Digest '09: SID International Symposium Digest of Technical Papers, May 31, 2009, pp. 184-187.

Nomura et al., "Carrier transport in transparent oxide semiconductor with intrinsic structural randomness probed using single-crystalline $InGaO_3(ZnO)_5$ films," Appl. Phys. Lett. (Applied Physics Letters), Sep. 13, 2004, vol. 85, No. 11, pp. 1993-1995.

Li et al., "Modulated Structures of Homologous Compounds $InMO_3(ZnO)_m$ ($M$=In,Ga; $m$=Integer) Described by Four-Dimensional Superspace Group," Journal of Solid State Chemistry, 1998, vol. 139, pp. 347-355.

Son et al., "42.4L: Late-News Paper: 4 Inch QVGA AMOLED Driven by the Threshold Voltage Controlled Amorphous GIZO ($Ga_2O_3$-$In_2O_3$-ZnO) TFT," SID Digest '08: SID International Symposium Digest of Technical Papers, May 20, 2008, vol. 39, pp. 633-636.

Lee et al., "World's Largest (15-inch) XGA AMLCD Panel Using IGZO Oxide TFT," SID Digest '08: SID International Symposium Digest of Technical Papers, May 20, 2008, vol. 39, pp. 625-628.

Nowatari et al., "60.2: Intermediate Connector with Suppressed Voltage Loss for White Tandem OLEDs," SID Digest '09: SID International Symposium Digest of Technical Papers, May 31, 2009, vol. 40, pp. 899-902.

Kanno et al., "White Stacked Electrophosphorecent Organic Light-Emitting Devices Employing $MoO_3$ as a Charge-Generation Layer," Adv. Mater. (Advanced Materials), 2006, vol. 18, No. 3, pp. 339-342.

Tsuda et al., "Ultra Low Power Consumption Technologies for Mobile TFT-LCDs," IDW '02: Proceedings of the $9^{th}$ International Display Workshops, Dec. 4, 2002, pp. 295-298.

Van de Walle, "Hydrogen as a Cause of Doping in Zinc Oxide," Phys. Rev. Lett. (Physical Review Letters), Jul. 31, 2000, vol. 85, No. 5, pp. 1012-1015.

Fung et al., "2-D Numerical Simulation of High Performance Amorphous In-Ga-Zn-O TFTs for Flat Panel Displays," AM-FPD '08 Digest of Technical Papers, Jul. 2, 2008, pp. 251-252, The Japan Society of Applied Physics.

Jeong et al., "3.1: Distinguished Paper: 12.1-Inch WXGA AMOLED Display Driven by Indium-Gallium-Zinc Oxide TFTs Array," SID Digest '08: SID International Symposium Digest of Technical Papers, May 20, 2008, vol. 39, No. 1, pp. 1-4.

Park et al., "High performance amorphous oxide thin film transistors with self-aligned top-gate structure," IEDM 09: Technical Digest of International Electron Devices Meeting, Dec. 7, 2009, pp. 191-194.

Kurokawa et al., "UHF RFCPUs on Flexible and Glass Substrates for Secure RFID Systems," Journal of Solid-State Circuits, 2008, vol. 43, No. 1, pp. 292-299.

Ohara et al., "Amorphous In-Ga-Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Coates et al., "Optical Studies of the Amorphous Liquid—Cholesteric Liquid Crystal Transition: The "Blue Phase"," Physics Letters, Sep. 10, 1973, vol. 45A, No. 2, pp. 115-116.

Cho et al., "21.2: Al and Sn-doped Zinc Indium Oxide Thin Film Transistors for AMOLED Back-Plane," SID Digest '09: SID International Symposium Digest of Technical Papers, May 31, 2009, pp. 280-283.

Lee et al., "15.4: Excellent Performance of Indium-Oxide-Based Thin-Film Transistors by DC Sputtering," SID Digest '09: SID International Symposium Digest of Technical Papers, May 31, 2009, pp. 191-193.

Jin et al., "65.2: Distinguished Paper: World-Largest (6.5") Flexible Full Color Top Emission AMOLED Display on Plastic Film and Its Bending Properties," SID Digest '09: SID International Symposium Digest of Technical Papers, May 31, 2009, pp. 983-985.

Sakata et al., "Development of 4.0-In. AMOLED Display with Driver Circuit Using Amorphous In-Ga-Zn-Oxide TFTs," IDW '09: Proceedings of the $16^{th}$ International Display Workshops, 2009, pp. 689-692.

Park et al., "Amorphous Indium-Gallium-Zinc Oxide TFTs and their Application for Large Size AMOLED," AM-FPD '08 Digest of Technical Papers, Jul. 2, 2008, pp. 275-278.

Park et al., "Challenge to Future Displays: Transparent AM-OLED Driven by PEALD Grown ZnO TFT," IMID '07 Digest, 2007, pp. 1249-1252.

Godo et al., "Temperature Dependence of Characteristics and Electronic Structure for Amorphous In-Ga-Zn-Oxide TFT," AM-FPD '09 Digest of Technical Papers, Jul. 1, 2009, pp. 41-44.

Osada et al., "Development of Driver-Integrated Panel using Amorphous In-Ga-Zn-Oxide TFT," AM-FPD '09 Digest of Technical Papers, Jul. 1, 2009, pp. 33-36.

Hirao et al., "Novel Top-Gate Zinc Oxide Thin-Film Transistors (ZnO TFTs) for AMLCDs," Journal of the SID, 2007, vol. 15, No. 1, pp. 17-22.

Hosono, "68.3: Invited Paper: Transparent Amorphous Oxide Semiconductors for High Performance TFT," SID Digest '07: SID International Symposium Digest of Technical Papers, 2007, vol. 38, pp. 1830-1833.

Godo et al., "P-9: Numerical Analysis on Temperature Dependence of Characteristics of Amorphous In-Ga-Zn-Oxide TFT," SID Digest '09: SID International Symposium Digest of Technical Papers, May 31, 2009, pp. 1110-1112.

Ohara et al., "21.3: 4.0 IN. QVGA AMOLED Display Using In-Ga-Zn-Oxide TFTs with a Novel Passivation Layer," SID Digest '09: SID International Symposium Digest of Technical Papers, May 31, 2009, pp. 284-287.

Miyasaka, "Suftla Flexible Microelectronics on their Way to Business," SID Digest '07: SID International Symposium Digest of Technical Papers, 2007, vol. 38, pp. 1673-1676.

Chern et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Kikuchi et al., "39.1: Invited Paper: Optically Isotropic Nano-Structured Liquid Crystal Composites for Display Applications," SID Digest '09: SID International Symposium Digest of Technical Papers, May 31, 2009, pp. 578-581.

Asaoka et al., "29.1: Polarizer-Free Reflective LCD Combined With Ultra Low-Power Driving Technology," SID Digest '09: SID International Symposium Digest of Technical Papers, May 31, 2009, pp. 395-398.

Lee et al., "Current Status of, Challenges to, and Perspective View of AM-OLED," IDW '06: Proceedings of the $13^{th}$ International Display Workshops, Dec. 7, 2006, pp. 663-666.

Kikuchi et al., "62.2: Invited Paper: Fast Electro-Optical Switching in Polymer-Stabilized Liquid Crystalline Blue Phases for Display Application," SID Digest '07: SID International Symposium Digest of Technical Papers, 2007, vol. 38, pp. 1737-1740.

Nakamura, "Synthesis of Homologous Compound with New Long-Period Structure," NIRIM Newsletter, Mar. 1, 1995, vol. 150, pp. 1-4.

(56) References Cited

OTHER PUBLICATIONS

Kikuchi et al., "Polymer-Stabilized Liquid Crystal Blue Phases," Nature Materials, Sep. 2, 2002, vol. 1, pp. 64-68.

Kimizuka et al., "Spinel, YbFe$_2$O$_4$, and Yb$_2$Fe$_3$O$_7$ Types of Structures for Compounds in the In$_2$O$_3$ and Sc$_2$O$_3$-A$_2$O$_3$-BO Systems [A: Fe, Ga, or Al; B: Mg, Mn, Fe, Ni, Cu, or Zn] at Temperatures Over 1000°C.," Journal of Solid State Chemistry, 1985, vol. 60, pp. 382-384.

Kitzerow et al., "Observation of Blue Phases in Chiral Networks," Liquid Crystals, 1993, vol. 14, No. 3, pp. 911-916.

Costello et al., "Electron Microscopy of a Cholesteric Liquid Crystal and its Blue Phase," Phys. Rev. A (Physical Review A), May 1, 1984, vol. 29, No. 5, pp. 2957-2959.

Meiboom et al., "Theory of the Blue Phase of Cholesteric Liquid Crystals," Phys. Rev. Lett. (Physical Review Letters), May 4, 1981, vol. 46, No. 18, pp. 1216-1219.

Park et al., "42.3: Transparent ZnO Thin Film Transistor for the Application of High Aperture Ratio Bottom Emission AM-OLED Display," SID Digest '08: SID International Symposium Digest of Technical Papers, May 20, 2008, vol. 39, pp. 629-632.

Orita et al., "Mechanism of Electrical Conductivity of Transparent InGaZnO$_4$," Phys. Rev. B (Physical Review B), Jan. 15, 2000, vol. 61, No. 3, pp. 1811-1816.

Nomura et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.

Janotti et al., "Native Point Defects in ZnO," Phys. Rev. B (Physical Review. B), Oct. 4, 2007, vol. 76, No. 16, pp. 165202-1-165202-22.

Park et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Hsieh et al., "P-29: Modeling of Amorphous Oxide Semiconductor Thin Film Transistors and Subgap Density of States," SID Digest '08: SID International Symposium Digest of Technical Papers, May 20, 2008, vol. 39, pp. 1277-1280.

Janotti et al., "Oxygen Vacancies in ZnO," Appl. Phys. Lett. (Applied Physics Letters), 2005, vol. 87, pp. 122102-1-122102-3.

Oba et al., "Defect energetics in ZnO: A hybrid Hartree-Fock density functional study," Phys. Rev. B (Physical Review B), 2008, vol. 77, pp. 245202-1245202-6.

Orita et al., "Amorphous transparent conductive oxide InGaO$_3$(ZnO)$_m$ (m<4): a Zn 4s conductor," Philosophical Magazine, 2001, vol. 81, No. 5, pp. 501-515.

Hosono et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Mo et al., "Amorphous Oxide TFT Backplanes for Large Size AMOLED Displays," IDW '08: Proceedings of the 6$^{th}$ International Display Workshops, Dec. 3, 2008, pp. 581-584.

Kim et al., "High-Performance oxide thin film transistors passivated by various gas plasmas," 214$^{th}$ ECS Meeting, 2008, No. 2317, ECS.

Clark et al., "First Principles Methods Using CASTEP," Zeitschrift fur Kristallographie, 2005, vol. 220, pp. 567-570.

Lany et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Park et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Oh et al., "Improving the Gate Stability of ZnO Thin-Film Transistors with Aluminum Oxide Dielectric Layers," J. Electrochem. Soc. (Journal of the Electrochemical Society), 2008, vol. 155, No. 12, pp. H1009-H1014.

Ueno et al., "Field-Effect Transistor on SrTiO$_3$ with Sputtered Al$_2$O$_3$ Gate Insulator," Appl. Phys. Lett. (Applied Physics Letters), Sep. 1, 2003, vol. 83, No. 9, pp. 1755-1757.

* cited by examiner

Zn    O

OXIDE SEMICONDUCTOR FILM AND SEMICONDUCTOR DEVICE

BACKGROUND OF THE INVENTION

1. Field of the Invention

The present invention relates to an oxide semiconductor film and a semiconductor device including the oxide semiconductor film.

Note that the semiconductor device in this specification refers to all devices that can function by utilizing semiconductor characteristics, and electro-optic devices, semiconductor circuits, and electronic appliances are all semiconductor devices.

2. Description of the Related Art

Transistors formed over a glass substrate or the like are manufactured using amorphous silicon, polycrystalline silicon, or the like, as typically seen in liquid crystal display devices. A transistor manufactured using amorphous silicon can easily be formed over a larger glass substrate. However, a transistor manufactured using amorphous silicon has a disadvantage of low field-effect mobility. Although a transistor manufactured using polycrystalline silicon has high field-effect mobility, it has a disadvantage of not being suitable for a larger glass substrate.

In contrast to a transistor manufactured using silicon with disadvantages as described above, a technique in which a transistor is manufactured using an oxide semiconductor and applied to an electronic device or an optical device has attracted attention. For example, Patent Document 1 discloses a technique in which a transistor is manufactured using an amorphous oxide containing In, Zn, Ga, Sn, and the like as an oxide semiconductor. In addition, Patent Document 2 discloses a technique in which a transistor similar to that in Patent Document 1 is manufactured and used as a switching element or the like in a pixel of a display device.

In addition, as for such an oxide semiconductor used in a transistor, there is also description as follows: an oxide semiconductor is insensitive to impurities, there is no problem when a considerable amount of metal impurities are contained in a film, and soda-lime glass which contains a large amount of alkali metals such as sodium and is inexpensive can also be used (see Non-Patent Document 1).

REFERENCE

Patent Document

[Patent Document 1] Japanese Published Patent Application No. 2006-165529
[Patent Document 2] Japanese Published Patent Application No. 2006-165528

Non-Patent Document

[Non-Patent Document 1] Kamiya, Nomura, and Hosono, "Carrier Transport Properties and Electronic Structures of Amorphous Oxide Semiconductors: The present status", KOTAI BUTSURI (SOLID STATE PHYSICS), 2009, Vol. 44, pp. 621-633

SUMMARY OF THE INVENTION

However, when an oxide semiconductor film remains amorphous, an oxygen vacancy or a dangling bond is likely to be generated in the oxide semiconductor film and carriers are generated in the film by the oxygen vacancy or dangling bond alone or in combination with hydrogen or the like. Therefore, electric characteristics of the oxide semiconductor film, such as the electric conductivity, might change. Such a phenomenon changes the electric characteristics of a transistor including the oxide semiconductor film, which leads to a reduction in the reliability of the semiconductor device.

Among oxide semiconductor films, an indium zinc oxide film, which is an oxide semiconductor film containing indium and zinc, has particularly superior electric characteristics such as mobility, and is expected as a promising material for a channel region in a transistor. However, as described above, the amorphous oxide semiconductor film containing indium and zinc has a problem of a reduction in reliability as a result of a change in electric characteristics. The problem is caused by the oxygen vacancy or the dangling bond and is common to oxide semiconductor films.

On the other hand, it is being turned out that in a process of forming the oxide semiconductor film, the crystallinity of the oxide semiconductor film is increased so as to improve electric characteristics. It is also being turned out that in a process of forming the oxide semiconductor film, the reliability of a transistor including the oxide semiconductor film is increased.

In view of the above problem, it is an object to provide an oxide semiconductor film which has stable electric characteristics and essentially consists of indium zinc oxide. It is another object to provide a highly reliable semiconductor device which has stable electric characteristics by using the oxide semiconductor film.

One embodiment of the disclosed invention is an oxide semiconductor film which essentially consists of indium zinc oxide and has a hexagonal crystal structure in which the a-b plane is substantially parallel to a surface of the oxide semiconductor film and a rhombohedral crystal structure in which the a-b plane is substantially parallel to the surface of the oxide semiconductor film.

Another embodiment of the disclosed invention is an oxide semiconductor film which essentially consists of indium zinc oxide and has a hexagonal crystal structure in which the a-b plane is substantially parallel to a surface of the oxide semiconductor film and a rhombohedral crystal structure in which the a-b plane is substantially parallel to the surface of the oxide semiconductor film. Further, the hexagonal crystal structure is a crystal structure of an oxide semiconductor having a composition ratio of In:Zn=1:1 and the rhombohedral crystal structure is a crystal structure of an oxide semiconductor having a composition ratio of In:Zn=2:1.

Another embodiment of the disclosed invention is a semiconductor device including a gate electrode, a first insulating film provided over the gate electrode, an oxide semiconductor film essentially consisting of indium zinc oxide provided over the first insulating film, a source electrode and a drain electrode provided in contact with the oxide semiconductor film, and a second insulating film provided over the oxide semiconductor film. Further, the oxide semiconductor film has a hexagonal crystal structure in which the a-b plane is substantially parallel to a surface of the oxide semiconductor film and a rhombohedral crystal structure in which the a-b plane is substantially parallel to the surface of the oxide semiconductor film.

Another embodiment of the disclosed invention is a semiconductor device including a gate electrode, a first insulating film provided over the gate electrode, an oxide semiconductor film essentially consisting of indium zinc oxide provided over the first insulating film, a source electrode and a drain electrode provided in contact with the oxide semiconductor film, and a second insulating film provided over the oxide semiconductor film. Further, the oxide semiconductor film has a hexagonal crystal structure in which the a-b plane is substantially parallel to a surface of the oxide semiconductor film and a rhombohedral crystal structure in which the a-b plane is substantially parallel to the surface of the oxide semiconductor film. Furthermore, the hexagonal crystal structure is a crystal structure of an oxide semiconductor having a composition ratio of In:Zn=1:1 and the rhombohedral crystal structure is a crystal structure of an oxide semiconductor having a composition ratio of In:Zn=2:1.

The oxide semiconductor film essentially consisting of indium zinc oxide disclosed in one embodiment of the present invention can have stable electric characteristics. By using such an oxide semiconductor film essentially consisting of indium zinc oxide for a transistor, a highly reliable semiconductor device having stable electric characteristics can be provided.

DETAILED DESCRIPTION OF THE INVENTION

Figure 1:
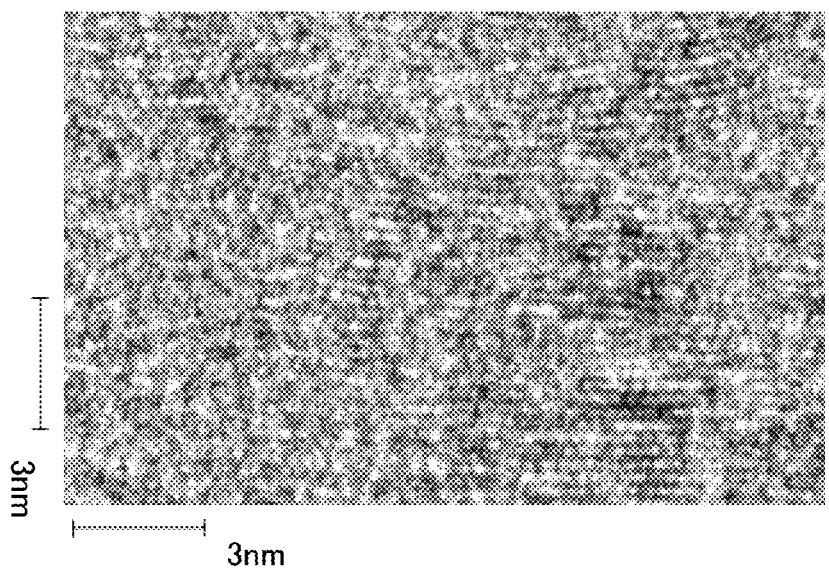
FIG. 1 is a cross-sectional TEM image according to one embodiment of the present invention.

Embodiments of the invention will be described below with reference to the accompanying drawings. Note that the invention is not limited to the following description, and it will be easily understood by those skilled in the art that various changes and modifications can be made without departing from the spirit and scope of the invention. Therefore, the invention should not be construed as being limited to the description in the following embodiments. Note that in structures of the present invention described hereinafter, the same portions or portions having similar functions are denoted by the same reference numerals in different drawings, and description thereof is not repeated.

Note that in each drawing described in this specification, the size, the layer thickness, or the region of each component is exaggerated for clarity in some cases. Therefore, embodiments of the present invention are not limited to such scales.

Note that terms such as "first", "second", and "third" in this specification are used in order to avoid confusion among components, and the terms do not limit the components numerically. Therefore, for example, the term "first" can be replaced with the term "second", "third", or the like as appropriate.

Embodiment 1

This embodiment shows a structure of an oxide semiconductor film essentially consisting of indium zinc oxide (hereinafter referred to as indium zinc oxide film) with reference to FIG. 1, FIGS. 2A and 2B, FIGS. 3A and 3B, and FIGS. 4A and 4B.

The indium zinc oxide film according to this embodiment includes a region having crystal structures. The region having crystal structures has a hexagonal crystal structure in which the a-b plane is substantially parallel to a surface of the indium zinc oxide film and a rhombohedral crystal structure in which the a-b plane is substantially parallel to the surface of the indium zinc oxide film.

Here, an indium zinc oxide film having hexagonal and rhombohedral crystal structures was formed, and a cross section thereof was observed with a transmission electron microscope (TEM). FIG. 1 shows a result of the observation (cross-sectional TEM image). In the cross-sectional TEM image shown in FIG. 1, a plurality of regions can be seen in which atoms are arranged in layers in the indium zinc oxide film.

Note that the sample of the cross-sectional TEM image of the indium zinc oxide film shown in FIG. 1 was formed in such a manner that indium zinc oxide was deposited to a thickness of 50 nm over a quartz substrate. The cross-sectional TEM image of the indium zinc oxide film was taken right after the deposition thereof with a sputtering apparatus using indium zinc oxide with a composition ratio of In:Zn=2:1 as a target. The deposition with the sputtering apparatus was conducted under the following conditions: the quartz substrate was heated at 200° C.; the DC power was 100 W; a gas having a flow rate ratio of oxygen to a mixed gas of argon and oxygen of 3:10 was used; and the deposition pressure was 0.4 Pa.

Figure 2A:
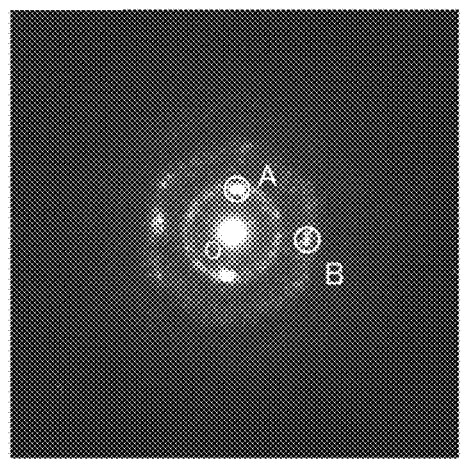
FIGS. 2A and 2B are electron beam diffraction patterns according to one embodiment of the present invention.
Figure 2B:
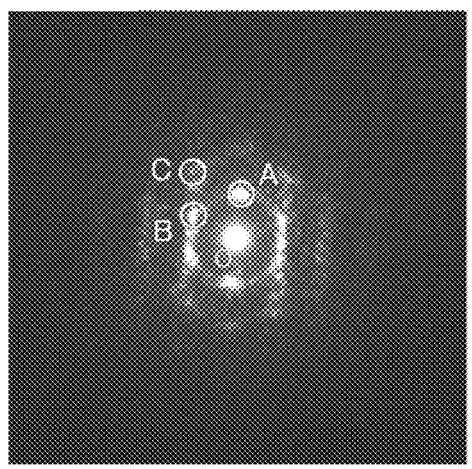

Next, FIGS. 2A and 2B show electron beam diffraction patterns obtained by perpendicularly irradiating, with an electron beam, cross sections of the indium zinc oxide film having hexagonal and rhombohedral crystal structures shown in FIG. 1. Since the electron beam diffraction patterns in FIGS. 2A and 2B are those of the cross section of the sample, the perpendicular (vertical) direction of the pattern is the c-axis direction.

Note that the cross-sectional TEM image and the electron beam diffraction patterns were taken with a transmission electron microscope H-9000-NAR manufactured by Hitachi High-Technologies Corporation at an acceleration voltage of 300 kV and a magnification of 8 million times.

The electron beam diffraction patterns shown in FIGS. 2A and 2B represent reciprocal lattice points in the crystal structures. When the sample has a crystal structure, the pattern has spots (A points, B points, and C point in FIGS. 2A and 2B); when the sample has a polycrystalline structure with a random crystal orientation or an amorphous structure, the pattern has a ring shape (also referred to as concentric shape). Therefore, from the electron beam diffraction patterns shown in FIGS. 2A and 2B, it is found that the indium zinc oxide film shown in FIG. 1 has crystal structures. Further, the electron beam diffraction patterns shown in FIGS. 2A and 2B are different from each other owing to a difference in crystal structures.

In the electron beam diffraction patterns shown in FIGS. 2A and 2B, diffraction spots A points, B points, and C point each represent a diffraction spot from a lattice plane, which was formed with an incident electron beam. The electron beam enters in a direction perpendicular to the cross section of the indium zinc oxide film.

A points in FIGS. 2A and 2B are each located on an axis substantially perpendicular to the horizontal axis in FIGS. 2A and 2B. Therefore, crystal structures of the indium zinc oxide film are found to have an a-axis and a b-axis which are parallel to a plane of the quartz substrate and to be oriented in the c-axis direction which is substantially perpendicular to the plane of the quartz substrate. That is, the crystal structures of the indium zinc oxide film are found to have an a-b plane in which the a-axis and b-axis are substantially parallel to the plane of the quartz substrate, and a surface of the indium zinc oxide film is a plane substantially parallel to the plane of the quartz substrate, i.e., the a-b plane is substantially parallel to the surface of the indium zinc oxide film.

In the electron beam diffraction patterns shown in FIGS. 2A and 2B, when an electron beam enters the indium zinc oxide film, a diffraction spot of an electron wave that passes through the indium zinc oxide film without diffraction is (000) spot (the central point in the electron beam diffraction pattern, O spots in FIGS. 2A and 2B). An angle formed by two of the diffraction spots and (000) spot between the diffraction spots is an angle formed by normals to lattice planes. Measurements of these angles can identify the crystal structure.

Specifically, in FIG. 2A, angle AOB formed by A point, O point, and B point is 90.0°. In FIG. 2B, angle AOB formed by A point, O point, and B point is 69.0°, angle AOC formed by A point, O point, and C point is 38.7°, and angle BOC formed by B point, O point, and C point is 30.3°. These results indicate that the electron beam diffraction patterns shown in FIGS. 2A and 2B are of a rhombohedral crystal (also referred to as trigonal crystal) and a hexagonal crystal, respectively.

Thus, the electron beam diffraction patterns shown in FIGS. 2A and 2B indicate that the indium zinc oxide film shown in FIG. 1 has a rhombohedral crystal structure in which the a-b plane is substantially parallel to a surface of the oxide semiconductor film and a hexagonal crystal structure in which the a-b plane is substantially parallel to the surface of the oxide semiconductor film.

Further, provided that $r_{(hkl)}$ is a distance [m] between one of the diffraction spots and (000) spot, $d_{(hkl)}$ is a lattice spacing [m], $\lambda$ is an electron beam wavelength [m], and L is a distance [m] between the indium zinc oxide film and a film for the diffraction pattern (camera length), the following formula (1) is satisfied.

$$r_{(hkl)} \times d_{(hkl)} = \lambda \times L \quad (1)$$

Note that the camera length L was set to 0.8 in the measurements of the electron beam diffraction patterns. The electron beam wavelength $\lambda$ was calculated from a formula (2).

$$\lambda = (h^2/(2\,mE))^{1/2} \quad (2)$$

From the formula (2), the electron beam wavelength $\lambda$ is found to be $2.75 \times 10^{-12}$ m. In the formula (2), h represents the Planck's constant ($6.626 \times 10^{-34}$ J·s), m represents a rest mass of an electron ($9.10 \times 10^{-31}$ kg), and E represents electron acceleration energy. Here, since an electron acceleration voltage was set to 200 kV, the electron acceleration energy E was $200 \times 10^3 \times 1.6 \times 10^{-19}$ J.

As described above, since the electron beam wavelength $\lambda$ and the camera length L are known, when $r_{(hkl)}$ is measured from the electron beam diffraction pattern, the lattice spacing $d_{(hkl)}$ can be estimated. Estimated lattice spacings $d_{(hkl)}$ are shown in Table 1. Note that the Miller index corresponding to each lattice spacing $d_{(hkl)}$ is an index obtained with reference to known crystal data of possibly corresponding substance, such as a JCPDS card.

TABLE 1

| Rhombohedral crystal (FIG. 2A) | | Hexagonal crystal (FIG. 2B) | |
|---|---|---|---|
| Miller index | Lattice spacing (nm) | Miller index | Lattice spacing (nm) |
| h k l = 1 0 0 | 0.299 | h k l = 1 0 0 | 0.292 |
| h k l = 0 0 9 | 0.292 | h k l = 0 0 8 | 0.288 |
| h k l = 1 0 3 | 0.283 | h k l = 1 0 4 | 0.260 |
| h k l = 1 0 6 | 0.247 | h k l = 1 1 0 | 0.169 |
| h k l = 1 0 9 | 0.209 | h k l = 1 0 12 | 0.161 |
| h k l = 1 0 12 | 0.177 | h k l = 1 1 8 | 0.146 |
| h k l = 1 1 0 | 0.173 | | |
| h k l = 1 1 9 | 0.149 | | |

An analysis using the lattice spacings $d_{(hkl)}$ and the Miller indexes indicates that the electron beam diffraction pattern shown in FIG. 2A is a pattern of $In_2ZnO_4$ having a composition ratio of In:Zn=2:1, and that the electron beam diffraction pattern shown in FIG. 2B is a pattern of $In_2Zn_2O_5$ having a composition ratio of In:Zn=1:1. Note that in the electron beam diffraction pattern shown in FIG. 2A, it is found that each number of "1" which is the Miller index in the c-axis direction of the obtained diffraction spot is a multiple of 3. Considering the symmetry, this result also indicates that the electron beam diffraction pattern shown in FIG. 2A is a pattern of the rhombohedral crystal (also referred to as trigonal crystal). Note that in the electron beam diffraction pattern shown in FIG. 2B, it is found that each number of "1" which is the Miller index in the c-axis direction of the obtained diffraction spot is a multiple of 2. Considering the symmetry, this result also indicates that the electron beam diffraction pattern shown in FIG. 2B is a pattern of the hexagonal crystal.

Next, Table 2 shows results of measurements of angles formed by two diffraction spots whose Miller indexes are estimated and (000) spot between the diffraction spots. From Table 1 and Table 2, it is found that lattice spacings $d_{(hkl)}$ and angles formed by (000) spot and the diffraction spots whose Miller indexes are estimated differ between the rhombohedral crystal in FIG. 2A and the hexagonal crystal in FIG. 2B.

TABLE 2

| Rhombohedral crystal (FIG. 2A) | | Hexagonal crystal (FIG. 2B) | |
|---|---|---|---|
| Angle formed by diffraction spots | Angle (°) | Miller index | Angle (°) |
| ∠009-103 | 71.1 | ∠008-104 | 63.2 |
| ∠009-106 | 55.7 | ∠008-1012 | 33.4 |
| ∠009-109 | 44.3 | ∠104-1012 | 29.8 |
| ∠009-1012 | 36.2 | ∠008-110 | 90.0 |
| ∠009-1015 | 30.4 | ∠008-118 | 59.7 |
| ∠009-110 | 90.0 | ∠110-118 | 30.3 |
| ∠009-119 | 59.4 | | |

By collating the results shown in Table 2 and the above-described known crystal data of possibly corresponding substances, the electron beam diffraction pattern shown in FIG. 2A is identified as a pattern of $In_2ZnO_4$ having a composition ratio of In:Zn=2:1, and the electron beam diffraction pattern shown in FIG. 2B is identified as a pattern of $In_2Zn_2O_5$ having a composition ratio of In:Zn=1:1.

From the above results in FIG. 1 and FIGS. 2A and 2B, it is found that the indium zinc oxide film according to this embodiment includes a region having a rhombohedral In$_2$ZnO$_4$ crystal structure and a hexagonal In$_2$Zn$_2$O$_5$ crystal structure. That is, a region having the crystal structures has a hexagonal In$_2$Zn$_2$O$_5$ crystal structure in which the a-b plane is substantially parallel to a surface of the indium zinc oxide film and has a rhombohedral In$_2$ZnO$_4$ crystal structure in which the a-b plane is substantially parallel to the surface of the indium zinc oxide film.

Therefore, the indium zinc oxide film having hexagonal and rhombohedral crystal structures have favorable crystallinity unlike an oxide semiconductor film which is entirely amorphous; thus, oxygen vacancies, dangling bonds, or impurities such as hydrogen bonded to dangling bonds or the like are reduced. An oxygen vacancy, a dangling bond, hydrogen bonded to a dangling bond or the like, or the like functions as a carrier trap or a source for supplying a carrier in the oxide semiconductor film, which might change the electric conductivity of the oxide semiconductor film. Therefore, the oxide semiconductor film having hexagonal and rhombohedral crystal structures in which such defects are reduced has stable electric conductivity and is more electrically stable with respect to irradiation with visible light, ultraviolet light, and the like.

The indium zinc oxide film according to this embodiment may include a plurality of regions each of which has a hexagonal crystal structure and a rhombohedral crystal structure, and a-axis or b-axis directions of crystal structures in the plurality of regions may be different from each other. However, it is preferable that regions with different a-axis or b-axis directions be not in contact with each other so as not to form a grain boundary at an interface where the regions are in contact with each other. Therefore, the oxide semiconductor film preferably has an amorphous region which surrounds the region having hexagonal and rhombohedral crystal structures.

Next, X-ray diffraction (XRD) measurement was further performed on the indium zinc oxide film. The measurement results that support the results in FIG. 1 and FIGS. 2A and 2B are shown below.

Figure 3A:
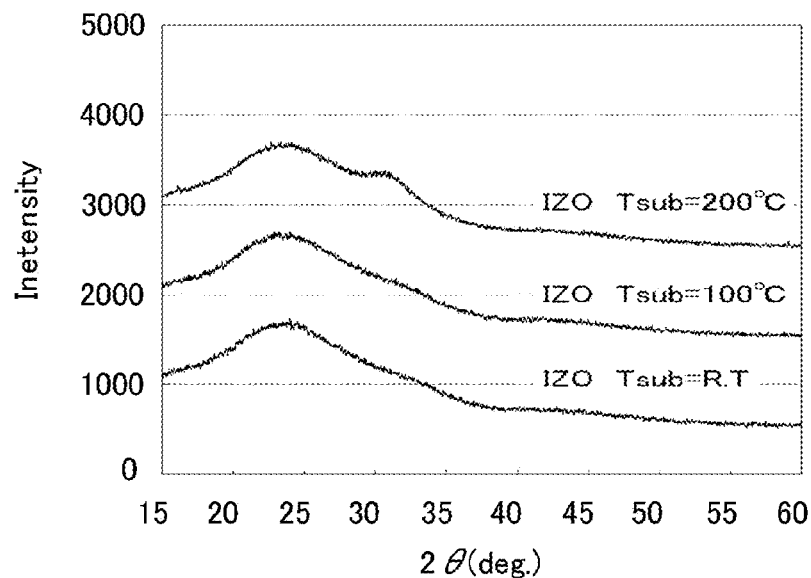
FIGS. 3A and 3B show XRD spectra according to one embodiment of the present invention.
Figure 3B:
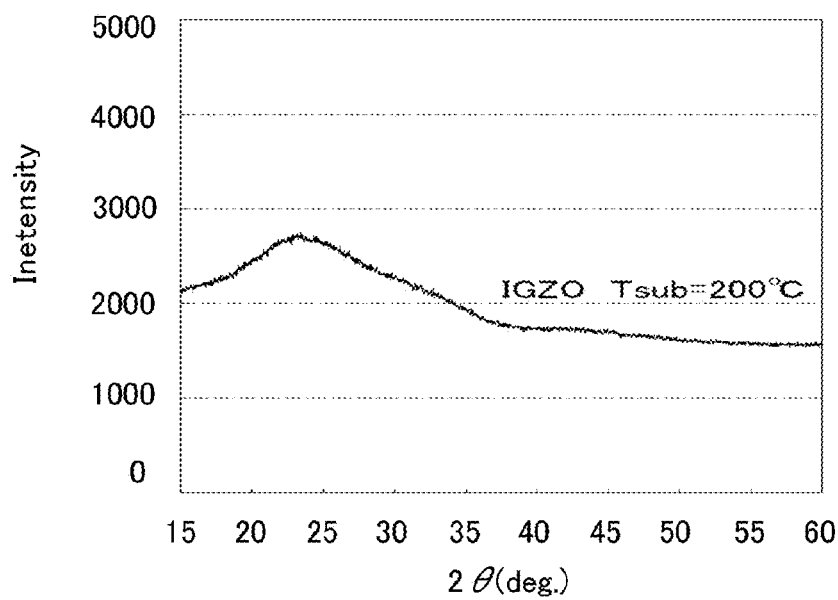

FIG. 3A shows XRD spectra of indium zinc oxide films measured by an out-of-plane method. As a comparative example, FIG. 3B shows an XRD spectrum of an indium zinc oxide film containing gallium (indium gallium zinc oxide (IGZO) film) measured by an out-of-plane method. In each of FIGS. 3A and 3B, the vertical axis represents X-ray diffraction intensity (arbitrary unit) and the horizontal axis represents rotation angle 2θ (deg.).

FIG. 3A shows results of measurements of XRD spectra of an indium zinc oxide film formed at a substrate temperature of room temperature (Tsub=R.T.), of an indium zinc oxide film formed at a substrate temperature of 100° C. (Tsub=100° C.), and of an indium zinc oxide film formed at a substrate temperature of 200° C. (Tsub=200° C.). FIG. 3B shows a result of measurement of the XRD spectrum of the indium zinc oxide containing gallium, which was deposited at a substrate temperature of 200° C. (Tsub=200° C.). Indium zinc oxide and indium zinc oxide containing gallium were deposited under the same conditions expect for the temperatures of the substrates which were quartz substrates.

In FIG. 3A, the indium zinc oxide film formed at the substrate temperature of 200° C. (Tsub=200° C.) has a strong peak around 2θ=30°; however, the indium zinc oxide films formed at the substrate temperatures of 100° C. (Tsub=100° C.) and room temperature (Tsub=R.T.) hardly have peaks around 2θ=30°. Similarly, in FIG. 3B, the indium zinc oxide film containing gallium, which was formed at the substrate temperature of 200° C. (Tsub=200° C.), does not have a peak around 2θ=30° either. The peak in FIG. 3A is due to diffraction on a (008) plane in the crystal structure of In$_2$Zn$_2$O$_5$. Thus, it is found that the indium zinc oxide film formed at the substrate temperature of 200° C. (Tsub=200° C.) is more likely to crystallize than the indium zinc oxide film containing gallium, which was formed under the same substrate temperature condition.

Figure 4A:
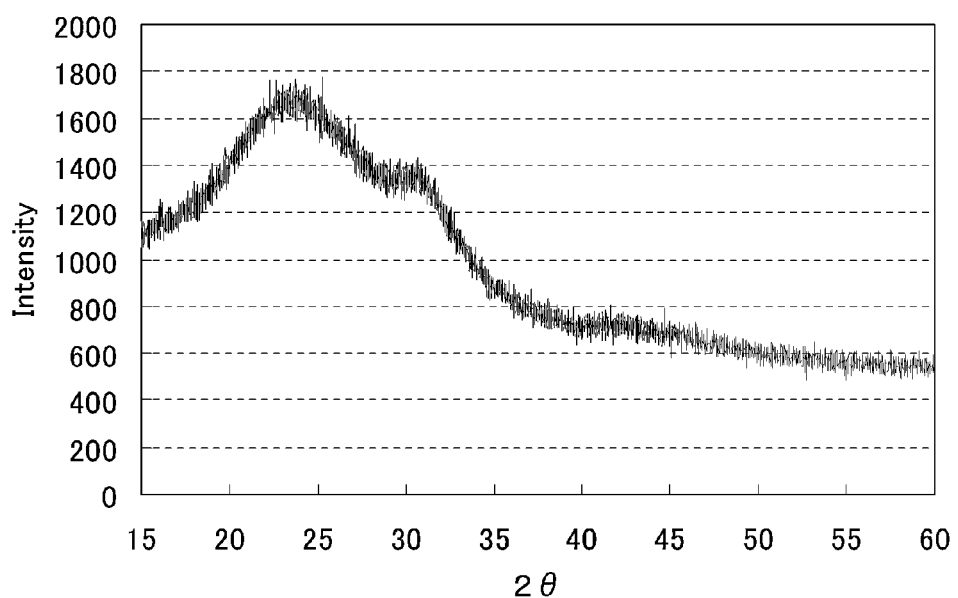
FIGS. 4A and 4B show XRD spectra according to one embodiment of the present invention.
Figure 4B:
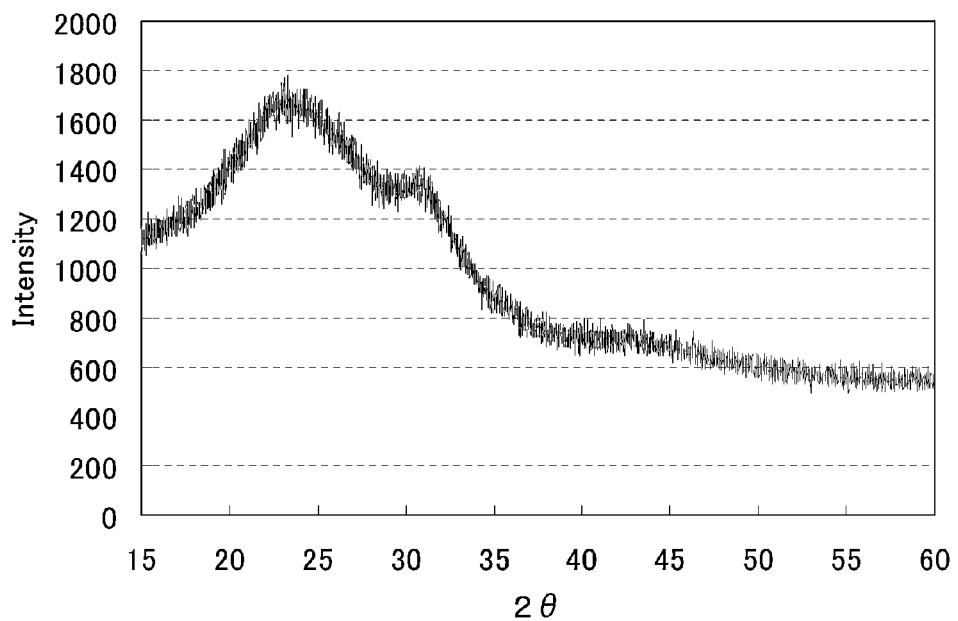

FIG. 4A shows an XRD spectrum of the indium zinc oxide film formed at the substrate temperature of 200° C. (Tsub=200° C.), which was measured by the out-of-plane method right after the film formation, whereas FIG. 4B shows an XRD spectrum of the indium zinc oxide film which was formed at the substrate temperature of 200° C. (Tsub=200° C.) and subjected to heat treatment at 350° C. in an atmosphere containing nitrogen and oxygen after the film formation, which was measured by the out-of-plane method. Before and after the heat treatment, the indium zinc oxide film formed at the substrate temperature of 200° C. (Tsub=200° C.) has a strong peak around 2θ=30°. As described above, the peak is due to diffraction on the (008) plane of the crystal structure of In$_2$Zn$_2$O$_5$. Thus, the crystal structure after the film formation is found to be stable.

By the above-described X-ray diffraction measurements, the indium zinc oxide film according to this embodiment can be said to have a crystal structure, which is definitely different from an amorphous oxide semiconductor film. Further, the indium zinc oxide film according to one embodiment of the present invention can be more likely to have a crystal structure even when the indium zinc oxide film is formed at a low substrate temperature than an indium zinc oxide film containing gallium, which is an oxide semiconductor film, formed under the same temperature condition. Note that the indium zinc oxide film according to this embodiment has a hexagonal In$_2$Zn$_2$O$_5$ crystal structure in which the a-b plane is substantially parallel to a surface of the indium zinc oxide film, and a rhombohedral In$_2$ZnO$_4$ crystal structure in which the a-b plane is substantially parallel to the surface of the indium zinc oxide film.

In the indium zinc oxide film according to this embodiment, impurities such as an alkali metal in the oxide semiconductor film are preferably reduced. For example, in the oxide semiconductor film, the concentration of lithium is $5 \times 10^{15}$ cm$^{-3}$ or lower, preferably $1 \times 10^{15}$ cm$^{-3}$ or lower; the concentration of sodium is $5 \times 10^{16}$ cm$^{-3}$ or lower, preferably $1 \times 10^{16}$ cm$^{-3}$ or lower, more preferably $1 \times 10^{15}$ cm$^{-3}$ or lower; and the concentration of potassium is $5 \times 10^{15}$ cm$^{-3}$ or lower, preferably $1 \times 10^{15}$ cm$^{-3}$ or lower.

An alkali metal and an alkaline earth metal are adverse impurities for the oxide semiconductor and are preferably reduced as much as possible. In particular, when the oxide semiconductor film containing such an impurity is used for a transistor, sodium, which is one of the alkali metals, possibly diffuses into an insulating film in contact with the oxide semiconductor film to cause fluctuations in the threshold voltage of the transistor or the like. In addition, sodium cleaves a bond between metal and oxygen or is inserted between the metal-oxygen bond in the oxide semiconductor film. As a result, transistor characteristics deteriorate (e.g., the transistor becomes normally-on (the shift of the threshold voltage to a negative side) or the mobility is decreased). In addition, this also causes variation in characteristics.

Accordingly, it is preferable that impurities in the oxide semiconductor film having hexagonal and rhombohedral crystal structures be extremely reduced, the concentration of an alkali metal be lower than or equal to $5 \times 10^{16}$ atoms/cm$^3$, and the concentration of hydrogen be lower than or equal to $5 \times 10^{19}$ atoms/cm$^3$.

The above-described indium zinc oxide film having hexagonal and rhombohedral crystal structures have favorable crystallinity unlike an oxide semiconductor film which is entirely amorphous; thus, oxygen vacancies, dangling bonds, or impurities such as hydrogen bonded to dangling bonds or the like are reduced. An oxygen vacancy, a dangling bond, hydrogen bonded to a dangling bond or the like, or the like functions as a carrier trap or a source for supplying a carrier in the oxide semiconductor film, which might change the electric conductivity of the oxide semiconductor film. Therefore, the oxide semiconductor film having hexagonal and rhombohedral crystal structures in which such defects are reduced has stable electric conductivity and is more electrically stable with respect to irradiation with visible light, ultraviolet light, and the like.

The structures and the like described in this embodiment can be combined as appropriate with any of the structures, methods, and the like described in other embodiments.

Embodiment 2

This embodiment shows a method of forming the indium zinc oxide film having hexagonal and rhombohedral crystal structures described in Embodiment 1 and a method of manufacturing a transistor including the indium zinc oxide film with reference to FIGS. 5A to 5E, FIGS. 6A and 6B, FIGS. 7A and 7B, FIGS. 8A and 8B, and FIGS. 9A to 9C. FIGS. 5A to 5E are cross-sectional views illustrating a process of manufacturing a top-gate transistor 120 which is an embodiment of the structure of a semiconductor device.

Figure 5A:
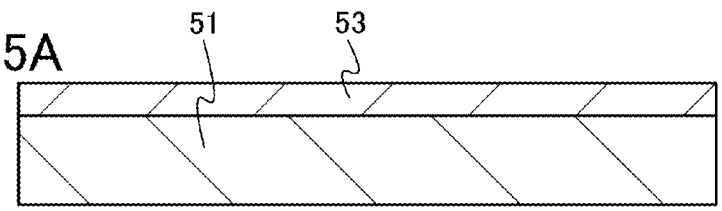
FIGS. 5A to 5E are cross-sectional views illustrating a process of manufacturing a semiconductor device according to one embodiment of the present invention.

First, before the indium zinc oxide film having hexagonal and rhombohedral crystal structures is formed, a base insulating film 53 is preferably formed over a substrate 51 as illustrated in FIG. 5A.

The substrate 51 needs to have at least heat resistance high enough to withstand heat treatment performed later. When a glass substrate is used as the substrate 51, a glass substrate whose strain point is 730° C. or higher is preferably used. For a glass substrate, a glass material such as aluminosilicate glass, aluminoborosilicate glass, or barium borosilicate glass is used, for example. Note that a glass substrate containing BaO and $B_2O_3$ so that the amount of BaO is larger than that of $B_2O_3$ is preferably used. In the case where the substrate 51 is mother glass, the substrate may have any of the following sizes: the first generation (320 mm×400 mm), the second generation (400 mm×500 mm), the third generation (550 mm×650 mm), the fourth generation (680 mm×880 mm or 730 mm×920 mm), the fifth generation (1000 mm×1200 mm or 1100 mm×1250 mm), the sixth generation (1500 mm×1800 mm), the seventh generation (1900 mm×2200 mm), the eighth generation (2160 mm×2460 mm), the ninth generation (2400 mm×2800 mm or 2450 mm×3050 mm), the tenth generation (2950 mm×3400 mm), and the like. The mother glass drastically shrinks when the treatment temperature is high and the treatment time is long. Thus, in the case where mass production is performed with the use of the mother glass, heat treatment in the manufacturing process is preferably performed at 600° C. or lower, further preferably, at 450° C. or lower.

Instead of the glass substrate, a substrate formed of an insulator, such as a ceramic substrate, a quartz substrate, or a sapphire substrate can be used. Alternatively, crystallized glass or the like can be used. Further alternatively, a substrate obtained by forming an insulating layer over a surface of a semiconductor substrate such as a silicon wafer or a surface of a conductive substrate formed of a metal material can be used.

The base insulating film 53 is preferably formed using an oxide insulating film from which part of contained oxygen is released by heat treatment. The oxide insulating film from which part of contained oxygen is released by heat treatment is preferably an oxide insulating film which contains oxygen exceeding the stoichiometry. By using the oxide insulating film from which part of contained oxygen is released by heat treatment as the base insulating film 53, oxygen can be diffused into the indium zinc oxide film by heat treatment in a later step. Typical examples of the oxide insulating film from which part of contained oxygen is released by heat treatment include films of silicon oxide, silicon oxynitride, aluminum oxide, aluminum oxynitride, gallium oxide, hafnium oxide, yttrium oxide, and the like.

The thickness of the base insulating film 53 is greater than or equal to 50 nm, preferably greater than or equal to 200 nm and less than or equal to 500 nm. With the thick base insulating film 53, the amount of oxygen released from the base insulating film 53 can be increased; thus, defects at the interface between the base insulating film 53 and the indium zinc oxide film to be formed later can be reduced.

The base insulating film 53 is formed by a sputtering method, a CVD method, or the like. The oxide insulating film from which part of contained oxygen is released by heat treatment can easily be formed by a sputtering method. When the oxide insulating film from which part of contained oxygen is released by heat treatment is formed by a sputtering method, the amount of oxygen in a deposition gas is preferably large, and oxygen, a mixed gas of oxygen and a rare gas, or the like can be used. Typically, the oxygen concentration of a deposition gas is preferably from 6% to 100%.

The base insulating film 53 is not necessarily formed using an oxide insulating film from which part of contained oxygen is released by heat treatment, and may be formed using a nitride insulating film formed using silicon nitride, silicon nitride oxide, aluminum nitride, or the like. In addition, the base insulating film 53 may have a layered structure including the oxide insulating film and the nitride insulating film; in such a case, the oxide insulating film is preferably provided over the nitride insulating film. When a glass substrate containing impurities such as an alkali metal is used, the use of the nitride insulating film as the base insulating film 53 can prevent entry of the alkali metal or the like into the indium zinc oxide film. Since an alkali metal such as lithium, sodium, or potassium is an adverse impurity for indium zinc oxide, the amount of such an alkali metal contained in the indium zinc oxide film is preferably small. The nitride insulating film can be formed by a CVD method, a sputtering method, or the like.

Figure 5B:
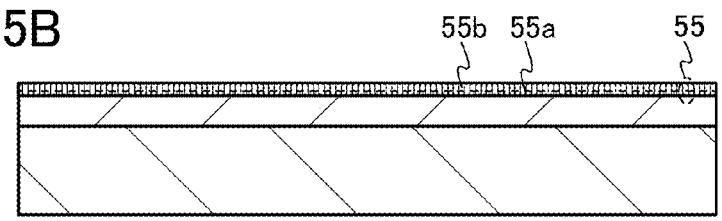

Next, as illustrated in FIG. 5B, an indium zinc oxide film 55 having hexagonal and rhombohedral crystal structures is formed to a thickness greater than or equal to 30 nm and less than or equal to 50 μm over the base insulating film 53 by a sputtering method using a sputtering apparatus.

Here, a treatment chamber of the sputtering apparatus is described with reference to FIG. 6A. An evacuation unit 33 and a gas supply unit 35 are connected to a treatment chamber 31. In the treatment chamber 31, a substrate support 40 and a target 41 are provided. The target 41 is connected to a power supply device 37.

The treatment chamber 31 is connected to GND. When the leakage rate of the treatment chamber 31 is lower than or equal to $1\times10^{-10}$ Pa·m$^3$/sec., entry of impurities into a film to be formed by a sputtering method can be suppressed.

In order to decrease the leakage rate, internal leakage as well as external leakage needs to be reduced. The external leakage refers to inflow of a gas from the outside of a vacuum system through a minute hole, a sealing defect, or the like.

The internal leakage is due to leakage through a partition, such as a valve, in a vacuum system or due to a released gas from an internal member. Measures need to be taken from both aspects of the external leakage and the internal leakage in order that the leakage rate be lower than or equal to $1 \times 10^{-10}$ Pa·m³/sec.

In order to decrease the external leakage, an open/close portion of the treatment chamber 31 is preferably sealed with a metal gasket. For the metal gasket, a metal material covered with iron fluoride, aluminum oxide, or chromium oxide is preferably used. The metal gasket achieves higher adhesion than an O-ring, and can reduce the external leakage. Further, with the use of a metal material covered with iron fluoride, aluminum oxide, chromium oxide, or the like which is in the passive state, a released gas containing hydrogen generated from the metal gasket is suppressed, so that the internal leakage can also be reduced.

As a member forming an inner wall of the treatment chamber 31, aluminum, chromium, titanium, zirconium, nickel, or vanadium, from which the amount of the released gas containing hydrogen is smaller, is used. An alloy material containing iron, chromium, nickel, and the like covered with the above-mentioned material may also be used. The alloy material containing iron, chromium, nickel, and the like is rigid, resistant to heat, and suitable for processing. Here, when surface unevenness of the member is decreased by polishing or the like to reduce the surface area, the released gas can be reduced. Alternatively, the above-mentioned member of the deposition apparatus may be covered with iron fluoride, aluminum oxide, chromium oxide, or the like which is in the passive state.

The member of the inner wall of the treatment chamber 31 is preferably formed with only a metal material as much as possible. For example, in the case where a viewing window formed with quartz or the like is provided, a surface is preferably covered thinly with iron fluoride, aluminum oxide, chromium oxide, or the like which is in the passive state so as to suppress the released gas.

Further, a refiner for a sputtering gas is preferably provided just in front of the treatment chamber 31. In this case, the length of a pipe between the refiner and the treatment chamber 31 is 5 m or less, preferably 1 m or less. When the length of the pipe is 5 m or less or 1 m or less, the effect of the released gas from the pipe can be reduced accordingly.

A pipe through which a sputtering gas flows from a cylinder to the treatment chamber 31 is preferably formed using a metal pipe whose inside is covered with iron fluoride, aluminum oxide, chromium oxide, or the like which is in the passive state. With the above-mentioned pipe, the amount of the released gas containing hydrogen can be small and entry of impurities into the deposition gas can be suppressed as compared with the case where a SUS316L-EP pipe is used, for example. Further, a high-performance ultra-compact metal gasket joint (UPG joint) is preferably used as a joint of the pipe. In addition, all the materials of the pipe are preferably metal materials because the effect of the generated released gas or the external leakage can be less than the case where a resin or the like is used.

Evacuation of the treatment chamber 31 is preferably performed with a rough vacuum pump, such as a dry pump, and a high vacuum pump such as a sputter ion pump, a turbo molecular pump or a cryopump, in appropriate combination. The turbo molecular pump has an outstanding capability in evacuating a large-sized molecule, whereas it has a low capability in evacuating hydrogen or water. Hence, the use in combination with a cryopump having a high capability in evacuating water or a sputter ion pump having a high capability in evacuating hydrogen is effective.

An adsorbate existing in the inside of the treatment chamber 31 does not affect the pressure in the treatment chamber 31 because it is adsorbed on the inner wall, but leads to release of gas at the time of the evacuation of the treatment chamber 31. Therefore, although the leakage rate and the evacuation rate do not have a correlation, it is important that the adsorbate existing in the treatment chamber 31 be desorbed as much as possible and evacuation be performed in advance with the use of a pump having high evacuation capability. Note that the treatment chamber 31 may be subjected to baking for promotion of desorption of the adsorbate. By the baking, the rate of desorption of the adsorbate can be increased about tenfold. The baking should be performed at higher than or equal to 100° C. and lower than or equal to 450° C. At this time, when the adsorbate is removed while an inert gas is introduced, the rate of desorption of water or the like, which is difficult to desorb only by evacuation, can be further increased.

The evacuation unit 33 can remove impurities in the treatment chamber 31 and control the pressure in the treatment chamber 31. An entrapment vacuum pump is preferably used for the evacuation unit 33. For example, a cryopump, an ion pump, or a titanium sublimation pump is preferably used. With the use of the above entrapment vacuum pump, the amount of hydrogen contained in the indium zinc oxide film can be reduced.

Note that hydrogen contained in the indium zinc oxide film may indicate a hydrogen molecule, water, a hydroxyl group, or hydride in some cases, in addition to a hydrogen atom.

The gas supply unit 35 supplies the treatment chamber 31 with a gas with which a target is sputtered. The gas supply unit 35 includes a cylinder filled with a gas, a pressure adjusting valve, a stop valve, a mass flow controller, and the like. Providing a refiner for the gas supply unit 35 makes it possible to reduce impurities contained in a gas introduced into the treatment chamber 31. As the gas with which the target is sputtered, a rare gas such as helium, neon, argon, xenon, or krypton is used. Alternatively, a mixed gas of oxygen and one of the above rare gases can be used.

As the power supply device 37, an RF power supply device, an AC power supply device, a DC power supply device, or the like can be used as appropriate. When a magnet is provided inside or outside a target support for supporting the target, which is not illustrated, high-density plasma can be confined in the periphery of the target, so that an improvement in deposition rate and a reduction in plasma damage on the substrate can be achieved. This method is referred to as magnetron sputtering method. Moreover, when the magnet can be rotated in employing the magnetron sputtering method, non-uniformity of a magnetic field can be suppressed, so that efficiency of use of the target is increased and variation in film quality in a substrate plane can be reduced.

The substrate support 40 is connected to GND. The substrate support 40 is provided with a heater. As a heater, a device for heating an object by heat conduction or heat radiation from a heater such as a resistance heater can be used.

As the target 41, a metal oxide target containing zinc is preferably used. As the target 41, a target of an In—Zn—O-based metal oxide which is a two-component metal oxide can be used. As the target of an In—Zn—O-based metal oxide, for example, a target having a composition ratio of $In_2O_3$:ZnO=1:1 [molar ratio] can be used, but the molar ratio of $In_2O_3$ to ZnO is not limited thereto.

The distance between the target 41 and the substrate 51 (T-S distance) is preferably set to a distance which enables an atom whose atomic weight is light to preferentially reach the base insulating film 53 over the substrate 51.

Figure 6A:
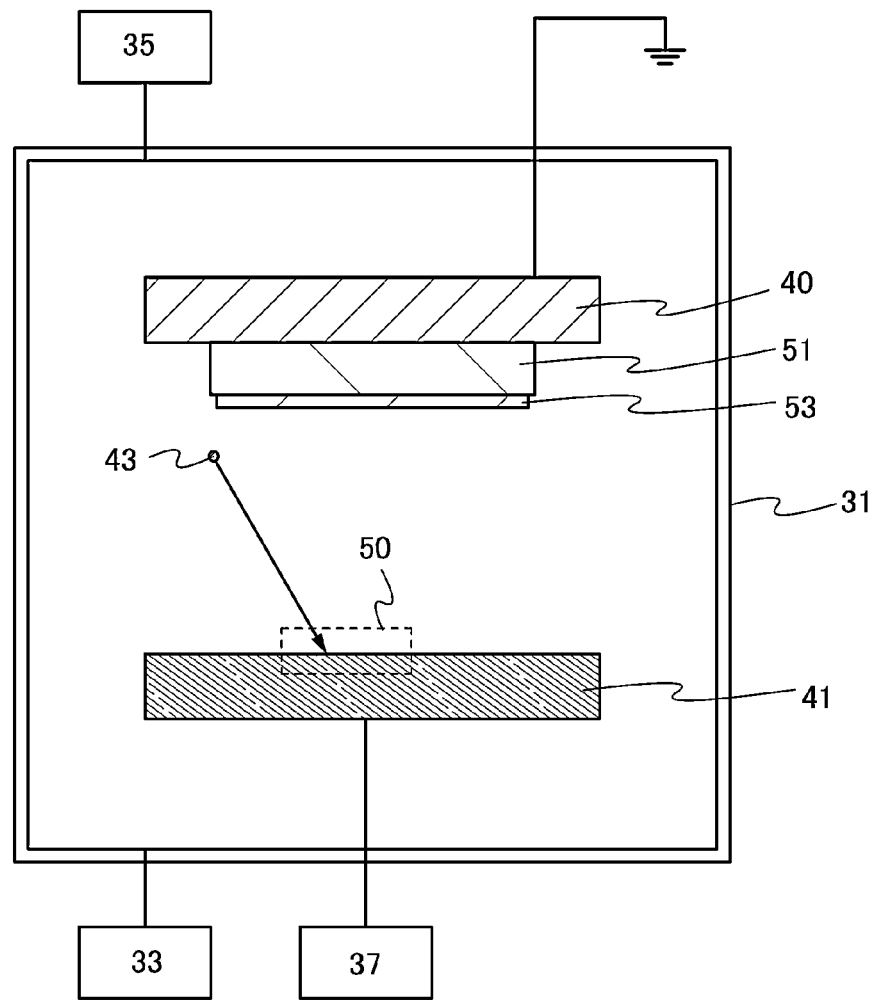
FIGS. 6A and 6B are schematic diagrams for describing a sputtering apparatus.

As illustrated in FIG. 6A, in the treatment chamber 31 of the sputtering apparatus, the substrate 51 over which the base insulating film 53 is formed is set over the substrate support 40. Next, a gas for sputtering the target 41 is introduced from the gas supply unit 35 into the treatment chamber 31. The purity of the target 41 is 99.9% or higher, preferably 99.99% or higher. Then, power is supplied to the power supply device 37 connected to the target 41. As a result, with the use of an ion 43 and an electron in the sputtering gas introduced from the gas supply unit 35 into the treatment chamber 31, the target 41 is sputtered.

Figure 6B:
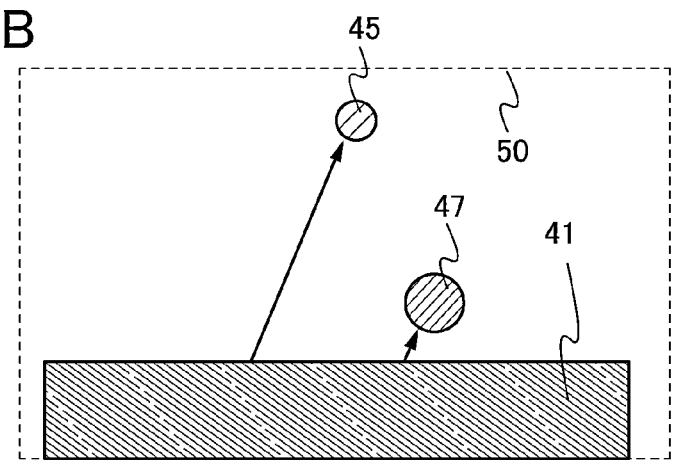

Here, the distance between the target 41 and the substrate 51 is set to a distance which enables an atom whose atomic weight is light to preferentially reach the base insulating film 53 over the substrate 51, whereby among atoms contained in the target 41, an atom 45 whose atomic weight is light can more preferentially move to the substrate side than an atom 47 whose atomic weight is heavy as illustrated in an enlarged view 50 in FIG. 6B.

Zinc has a lower atomic weight than indium. Therefore, zinc is preferentially deposited over the base insulating film 53. Further, since an atmosphere for the deposition contains oxygen and the substrate support 40 is provided with a heater for heating the substrate and the deposited film during the deposition, zinc deposited over the base insulating film 53 is oxidized, so that a hexagonal or rhombohedral seed crystal 55a containing zinc, typically, a hexagonal or rhombohedral seed crystal containing zinc oxide is formed.

The hexagonal or rhombohedral seed crystal 55a, for example, a hexagonal seed crystal containing zinc, includes bonds for forming hexagonal lattices in the a-b plane. The hexagonal seed crystal containing zinc contains a crystal containing zinc and having a hexagonal wurtzite structure in which the a-b plane is substantially parallel to the surface of the indium zinc oxide film and the c-axis is substantially perpendicular to the surface of the indium zinc oxide film.

Figure 7A:
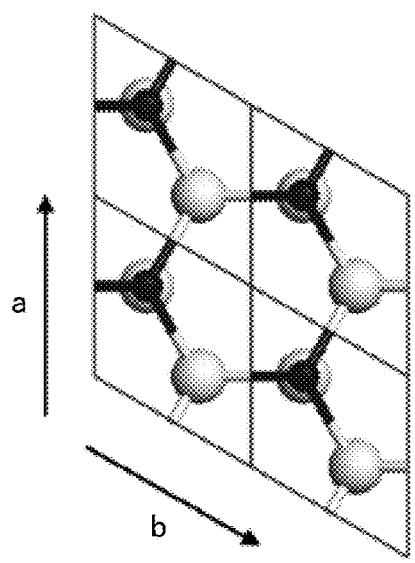
FIGS. 7A and 7B are schematic diagrams illustrating a crystal structure of a seed crystal.
Figure 7B:
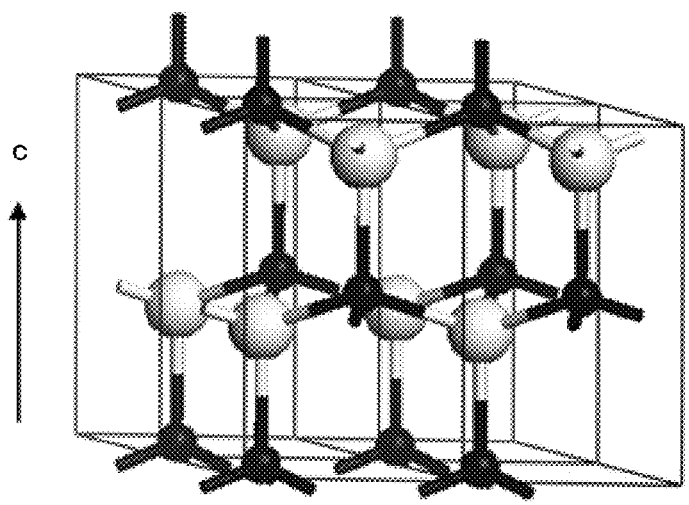
Figure 7B:
Figure 7B:

The following shows the hexagonal crystal containing zinc and including bonds for forming hexagonal lattices in the a-b plane and in which the a-b plane is substantially parallel to the surface of the indium zinc oxide film and the c-axis is substantially perpendicular to the surface of the indium zinc oxide film with reference to FIGS. 7A and 7B. As a typical example of the hexagonal crystal containing zinc, zinc oxide is described. A black sphere represents zinc, and a white sphere represents oxygen. FIG. 7A is a schematic diagram of zinc oxide having a hexagonal crystal structure in the a-b plane, and FIG. 7B is a schematic diagram of zinc oxide having a hexagonal crystal structure in which the longitudinal direction of the drawing is the c-axis direction. As illustrated in FIG. 7A, in a plan top surface of the a-b plane, zinc and oxygen are bonded to form a hexagon. As illustrated in FIG. 7B, layers in each of which zinc and oxygen are bonded to form hexagonal lattices are stacked, and the c-axis direction is perpendicular to the a-b plane. The seed crystal 55a includes, in the c-axis direction, at least one atomic layer including bonds for forming hexagonal lattices in the a-b plane.

Note that the seed crystal 55a includes, in addition to the hexagonal seed crystal containing zinc, a rhombohedral seed crystal containing zinc. In this case, the seed crystal 55a includes bonds for forming square lattices in the a-b plane. The rhombohedral seed crystal containing zinc contains a rhombohedral crystal containing zinc and having a crystal structure in which the a-b plane is substantially parallel to the surface of the indium zinc oxide film and the c-axis is not perpendicular to the surface of the indium zinc oxide film.

The target 41 is continuously sputtered with the use of a sputtering gas, whereby atoms contained in the target are deposited over the seed crystal 55a. At this time, crystal growth is caused with the use of the seed crystal 55a as a nucleus, so that an indium zinc oxide film 55b having a hexagonal crystal structure can be formed over the seed crystal 55a. Note that since the substrate 51 is heated by the heater of the substrate support 40, crystal growth of the atoms deposited over the surface progresses with the use of the seed crystal 55a as a nucleus while the atoms are oxidized.

In formation of the indium zinc oxide film 55b, crystal growth of an atom with heavy atomic weight at the surface of the target 41 and an atom with light atomic weight sputtered after formation of the seed crystal 55a is caused with the use of the seed crystal 55a having a hexagonal or rhombohedral crystal structure as a nucleus while the atoms are oxidized. Thus, like the seed crystal 55a, the indium zinc oxide film 55b includes a region having a crystal structure which includes bonds for forming hexagonal or square lattices in the a-b plane and in which the a-b plane is substantially parallel to the surface of the indium zinc oxide film. Note that in FIG. 5B, the interface between the seed crystal 55a and the indium zinc oxide film 55b is denoted by a dotted line for description of a stacked layer structure of the indium zinc oxide film; however, the interface is actually not distinct and is illustrated for easy understanding.

The substrate is heated by the heater at this time at higher than 100° C. and lower than or equal to 400° C., preferably higher than or equal to 250° C. and lower than or equal to 350° C. By performing deposition while the substrate is heated at higher than 100° C. and lower than or equal to 400° C., preferably higher than or equal to 250° C. and lower than or equal to 350° C., heat treatment can be performed at the same time as the deposition, so that the indium zinc oxide film including a region having hexagonal and rhombohedral crystal structures can be formed. Note that the temperature of a surface where a film is formed in the sputtering is higher than or equal to 250° C. and lower than or equal to the upper limit of the heating treatment of the substrate.

As a sputtering gas, a rare gas (typically argon), oxygen, or a mixed gas of a rare gas and oxygen is used as appropriate. A high-purity gas from which an impurity such as hydrogen, water, a hydroxyl group, or hydride is removed is preferably used as a sputtering gas.

When the pressure of the treatment chamber including the substrate support 40 and the target 41 is lower than or equal to 0.4 Pa, entry of an impurity such an alkali metal or hydrogen into a surface of the indium zinc oxide film having hexagonal and rhombohedral crystal structures or the inside thereof can be suppressed.

Moreover, when the leakage rate of the treatment chamber of the sputtering apparatus is set to lower than or equal to $1 \times 10^{-10}$ Pa·m$^3$/sec., entry of an impurity such as an alkali metal, hydrogen, water, a hydroxyl group, or hydride into the oxide indium zinc oxide film having hexagonal and rhombohedral crystal structures, which is being formed by a sputtering method can be suppressed. Further, with the use of an entrapment vacuum pump as an evacuation system, counter flow of an impurity such as an alkali metal, hydrogen, water, a hydroxyl group, or hydride from the evacuation system can be reduced.

When the purity of the target 41 is set to higher than or equal to 99.99%, entry of an alkali metal, hydrogen, water, a hydroxyl group, hydride, or the like into the indium zinc oxide film having hexagonal and rhombohedral crystal structures can be suppressed. With the use of the target, in the indium zinc oxide film 55, the concentration of lithium can be $5\times10^{15}$ cm$^{-3}$ or lower, preferably $1\times10^{15}$ cm$^{-3}$ or lower; the concentration of sodium can be $5\times10^{16}$ cm$^{-3}$ or lower, preferably $1\times10^{16}$ cm$^{-3}$ or lower, further preferably $1\times10^{15}$ cm$^{-3}$ or lower; and the concentration of potassium can be $5\times10^{15}$ cm$^{-3}$ or lower, preferably $1\times10^{15}$ cm$^{-3}$ or lower.

In the above deposition method, in one sputtering step, by utilizing a difference in atomic weight of atoms contained in the target, zinc with light atomic weight is preferentially deposited on the oxide insulating film to form a seed crystal, and indium or the like with heavy atomic weight is deposited on the seed crystal while crystal growth is carried out. Thus, the indium zinc oxide film having hexagonal and rhombohedral crystal structures can be formed without performing a plurality of steps.

In the above method of forming the indium zinc oxide film 55, by a sputtering method, the seed crystal 55a and the indium zinc oxide film 55b are formed and crystallized at the same time; however, the oxide semiconductor film according to this embodiment is not necessarily formed in this manner. For example, formation and crystallization of the seed crystal and the indium zinc oxide film may be performed in separate steps.

Figure 8A:
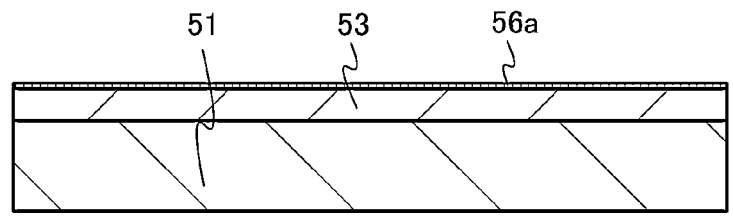
FIGS. 8A and 8B are cross-sectional views illustrating a process of manufacturing a semiconductor device according to one embodiment of the present invention.
Figure 8B:
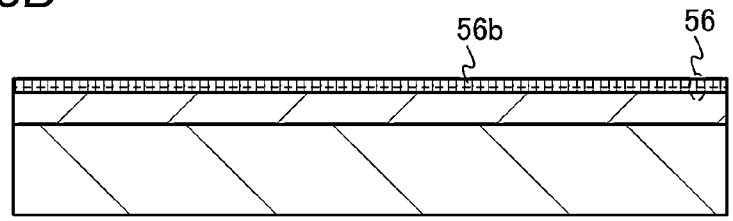

A method in which formation and crystallization of the seed crystal and the indium zinc oxide film are performed in separate steps is described below with reference to FIGS. 8A and 8B. In this specification, the method of forming the indium zinc oxide film having hexagonal and rhombohedral crystal structures as described below is referred to as "two-step method" in some cases.

In performing the two-step method, first, a first indium zinc oxide film with a thickness greater than or equal to 1 nm and less than or equal to 10 nm is formed over the base insulating film 53. The first indium zinc oxide film is formed by a sputtering method, and the substrate temperature in the film formation by a sputtering method is preferably set to higher than or equal to 200° C. and lower than or equal to 400° C. The other film formation conditions are similar to those of the above method for forming the indium zinc oxide film.

Next, first heat treatment is performed under a condition where the atmosphere of a chamber in which the substrate is set is an atmosphere containing nitrogen or dry air. The temperature of the first heat treatment is higher than or equal to 400° C. and lower than or equal to 750° C. Through the first heat treatment, the first indium zinc oxide film is crystallized, so that a seed crystal 56a is formed (see FIG. 8A).

Depending on the temperature of the first heat treatment, the first heat treatment causes crystallization from a film surface and crystal grows from the film surface toward the inside of the film; thus, an oxide semiconductor film having hexagonal and rhombohedral crystal structures is obtained. With the first heat treatment, large amounts of zinc and oxygen gather at the film surface, one or a plurality of layers of a graphene-like two-dimensional crystal made of zinc and oxygen which are bonded to form a hexagon and a square on the top plane is formed on the uppermost surface, and the two-dimensional crystal grows in the thickness direction and overlaps with one another to form a stack. By increasing the temperature of the heat treatment, crystal growth proceeds from the surface to the inside and further from the inside to the bottom.

In addition, by using an indium zinc oxide film from which part of contained oxygen is released by heat treatment as the base insulating film 53, oxygen in the base insulating film 53 can be diffused into the interface between the base insulating film 53 and the seed crystal 56a or in the vicinity thereof (±5 nm from the interface) by the first heat treatment, whereby oxygen vacancies in the seed crystal 56a can be reduced.

Next, a second indium zinc oxide film with a thickness greater than 10 nm is formed over the seed crystal 56a. The second indium zinc oxide film is formed by a sputtering method, and the substrate temperature in the film formation is set to higher than or equal to 200° C. and lower than or equal to 400° C. The other film formation conditions are similar to those of the above method of forming the indium zinc oxide film.

Next, second heat treatment is performed under a condition where the atmosphere of a chamber in which the substrate is set is an atmosphere containing nitrogen or dry air. The temperature of the second heat treatment is higher than or equal to 400° C. and lower than or equal to 750° C. Through the second heat treatment, the second indium zinc oxide film is crystallized, so that an indium zinc oxide film 56b is formed (see FIG. 8B). The second heat treatment is performed in an atmosphere containing nitrogen, an atmosphere containing oxygen, or a mixed atmosphere containing nitrogen and oxygen in order to increase the density of the indium zinc oxide film 56b and to reduce the number of oxygen vacancies therein. By the second heat treatment, crystal growth proceeds in the thickness direction with the use of the seed crystal 56a as a nucleus, that is, crystal growth proceeds from the bottom to the inside; thus, the indium zinc oxide film 56b having hexagonal and rhombohedral crystal structures is formed. In this manner, an indium zinc oxide film 56 including the seed crystal 56a and the indium zinc oxide film 56b is formed. In FIG. 8B, the indium zinc oxide film is illustrated by denoting the interface between the seed crystal 56a and the indium zinc oxide film 56b by a dotted line; however, the interface is not distinct and is illustrated for easy understanding.

It is preferable that the steps from the formation of the base insulating film 53 to the second heat treatment be performed successively without exposure to the air. The steps from the formation of the base insulating film 53 to the second heat treatment are preferably performed in an atmosphere which is controlled so as not to substantially contain hydrogen and moisture (such as an inert atmosphere, a reduced-pressure atmosphere, or a dry-air atmosphere); in terms of moisture, for example, a dry nitrogen atmosphere with a dew point of −40° C. or lower, preferably a dew point of −50° C. or lower is preferably employed.

In the above method for film formation, a favorable indium zinc oxide film having hexagonal and rhombohedral crystal structures can be formed even at a low substrate temperature in the film formation, as compared with the method in which atoms whose atomic weight is light are preferentially deposited on the oxide insulating film. Note that the indium zinc oxide film 56 formed by the above two-step method has substantially the same crystallinity as the indium zinc oxide film 55 which is formed by the method in which atoms whose atomic weight is light are preferentially deposited on the oxide insulating film, and the indium zinc oxide film 56 also has stable electric conductivity. Therefore, a highly reliable semiconductor device having stable electric characteristics can be provided by using the indium zinc oxide film which is formed by either of the above methods. As for a process described below, a process of manufacturing the transistor 120 with the use of the indium zinc oxide film 55 is described; however, the indium zinc oxide film 56 can also be used similarly.

Through the above process, the indium zinc oxide film 55 including a stack of the seed crystal 55a and the indium zinc oxide film 55b can be formed over the base insulating film 53. Next, it is preferable that heat treatment be performed on the substrate 51 so that hydrogen is released from the indium zinc oxide film 55 and part of oxygen contained in the base insulating film 53 can be diffused into the indium zinc oxide film 55 and in the vicinity of the interface between the base insulating film 53 and the indium zinc oxide film 55.

The temperature of the heat treatment is preferably a temperature at which hydrogen is released from the indium zinc oxide film 55 and part of oxygen contained in the base insulating film 53 is released and diffused into the indium zinc oxide film 55. The temperature is typically higher than or equal to 150° C. and lower than the strain point of the substrate 51, preferably higher than or equal to 250° C. and lower than or equal to 450° C. When the heat treatment temperature is higher than the temperature in forming the oxide semiconductor film having hexagonal and rhombohedral crystal structures, a larger amount of oxygen contained in the base insulating film 53 can be released.

The heat treatment is preferably performed in an inert gas atmosphere, an atmosphere containing oxygen, an atmosphere containing nitrogen, or a mixed atmosphere containing oxygen and nitrogen, which do not substantially contain hydrogen and moisture. As an inert gas atmosphere, typically, an atmosphere containing a rare gas such as helium, neon, argon, xenon, or krypton is preferable. In addition, heating time of the heat treatment is longer than or equal to 1 minute and shorter than or equal to 24 hours.

This heat treatment enables release of hydrogen from the indium zinc oxide film 55 and diffusion of part of oxygen contained in the base insulating film 53 into the indium zinc oxide film 55 and in the vicinity of the interface between the base insulating film 53 and the indium zinc oxide film 55. Through this process, oxygen vacancies in the indium zinc oxide film 55 can be reduced. As a result, it is possible to form an indium zinc oxide film including an oxide semiconductor with reduced hydrogen concentration and reduced oxygen vacancies and having hexagonal and rhombohedral crystal structures.

Figure 5C:
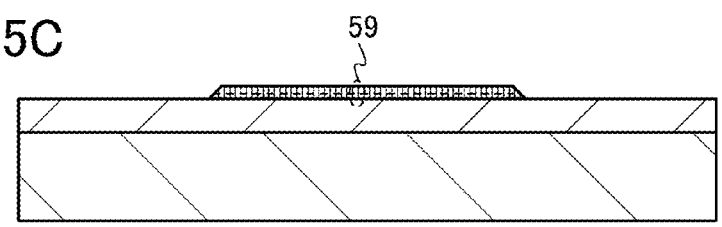

Next, a mask is formed over the indium zinc oxide film 55, and then the indium zinc oxide film 55 is selectively etched with the use of the mask, so that an indium zinc oxide film 59 is formed as illustrated in FIG. 5C. After that, the mask is removed.

The mask used in the etching of the indium zinc oxide film 55 can be formed as appropriate by a photolithography method, an inkjet method, a printing method, or the like. Wet etching or dry etching may be employed as appropriate for the etching of the indium zinc oxide film 55.

Figure 5D:
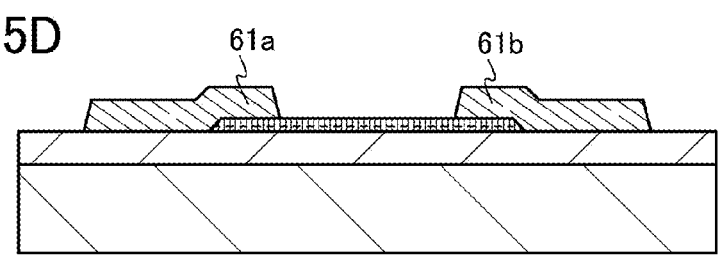

Next, as illustrated in FIG. 5D, a source electrode 61a and a drain electrode 61b which are in contact with the indium zinc oxide film 59 are formed.

The source electrode 61a and the drain electrode 61b can be formed using a metal element selected from aluminum, chromium, copper, tantalum, titanium, molybdenum, tungsten, manganese, and zirconium; an alloy containing any of these metal elements as a component; an alloy containing any of these metal elements in combination; or the like. Alternatively, an alloy film or a nitride film which contains aluminum and one or more metal elements selected from titanium, tantalum, tungsten, molybdenum, chromium, neodymium, and scandium may be used. The source electrode 61a and the drain electrode 61b may be a single layer or a stack of two or more layers. For example, it is possible to use a single-layer structure of an aluminum film containing silicon, a two-layer structure in which a copper film is stacked over a Cu—Mg—Al alloy film, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film, a three-layer structure in which a titanium film, an aluminum film, and a titanium film are stacked in this order, or the like.

The source electrode 61a and the drain electrode 61b can also be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to have a stacked-layer structure formed using the above light-transmitting conductive material and the above metal element.

After a conductive film is formed by a sputtering method, a CVD method, an evaporation method, or the like, a mask is formed over the conductive film and the conductive film is etched, whereby the source electrode 61a and the drain electrode 61b are formed. The mask formed over the conductive film can be formed by a printing method, an inkjet method, a photolithography method, or the like as appropriate. Alternatively, the source electrode 61a and the drain electrode 61b can be directly formed by a printing method or an inkjet method.

At this time, the conductive film is formed over the indium zinc oxide film 59 and the base insulating film 53, and etched into a predetermined pattern to form the source electrode 61a and the drain electrode 61b.

Alternatively, the indium zinc oxide film 59, the source electrode 61a, and the drain electrode 61b may be formed in such a manner that a conductive film is formed over the indium zinc oxide film 55, and the indium zinc oxide film 55 and the conductive film are etched with the use of a multi-tone photomask. In the above manner, an uneven mask is formed, the indium zinc oxide film 55 and the conductive film are etched with the use of the uneven mask, the uneven mask is divided by ashing, and the conductive film is selectively etched with masks obtained by the dividing, whereby the indium zinc oxide film 59, the source electrode 61a, and the drain electrode 61b can be formed. In this process, the number of the photomasks used and the number of steps in the photolithography process can be reduced.

Figure 5E:
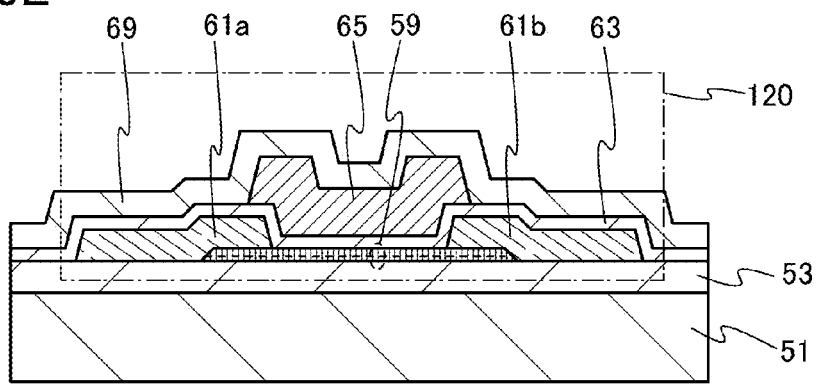

Then, a gate insulating film 63 is formed over the indium zinc oxide film 59, the source electrode 61a, and the drain electrode 61b as illustrated in FIG. 5E.

The gate insulating film 63 can be formed with a single layer or a stacked layer of silicon oxide, silicon oxynitride, silicon nitride, silicon nitride oxide, aluminum oxide, aluminum oxynitride, or gallium oxide. It is preferable that a portion in the gate insulating film 63 which is in contact with the indium zinc oxide film 59 contain oxygen. It is more preferable that the gate insulating film 63 be formed using an oxide insulating film from which part of contained oxygen is released by heat treatment, like the base insulating film 53. By using a silicon oxide film as the oxide insulating film from which oxygen is released, oxygen can be diffused into the indium zinc oxide film 59 in heat treatment in a later step, whereby characteristics of the transistor 120 can be favorable.

The gate insulating film 63 is formed using a high-k material such as hafnium silicate ($HfSiO_x$), hafnium silicate to which nitrogen is added ($HfSi_xO_yN_z$), hafnium aluminate to which nitrogen is added ($HfAl_xO_yN_z$), hafnium oxide, or yttrium oxide, so that gate leakage current can be reduced. Further, a stacked structure can be used in which a high-k material and one or more of silicon oxide, silicon oxynitride, silicon nitride, silicon nitride oxide, aluminum oxide, aluminum oxynitride, and gallium oxide are stacked. The thickness of the gate insulating film 63 is preferably from 1 nm to 300 nm, and more preferably from 5 nm to 50 nm. When the thickness of the gate insulating film 63 is 5 nm or more, gate leakage current can be reduced.

Before the gate insulating film 63 is formed, the surface of the indium zinc oxide film 59 may be exposed to plasma of an oxidative gas such as oxygen, ozone, or dinitrogen monoxide so as to be oxidized, thereby reducing oxygen vacancies.

Next, a gate electrode 65 is formed in a region which is over the gate insulating film 63 and overlaps with the indium zinc oxide film 59.

The gate electrode 65 can be formed using a metal element selected from aluminum, chromium, copper, tantalum, titanium, molybdenum, tungsten, manganese, and zirconium; an alloy containing any of these metal elements as a component; an alloy containing any of these metal elements in combination; or the like. Alternatively, an alloy film or a nitride film which contains aluminum and one or more metal elements selected from titanium, tantalum, tungsten, molybdenum, chromium, neodymium, and scandium may be used. Further, the gate electrode 65 may have a single-layer structure or a stacked-layer structure of two or more layers. For example, it is possible to use a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film, a three-layer structure in which a titanium film, an aluminum film, and a titanium film are stacked in this order, or the like.

The gate electrode 65 can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. In addition, a compound conductor obtained by sputtering using an In—Ga—Zn—O-based metal oxide as a target in an atmosphere containing nitrogen may be used. It is also possible to have a stacked-layer structure formed using the above light-transmitting conductive material and the above metal element.

Further, an insulating film 69 may be formed as a protective film over the gate electrode 65 (see FIG. 5E). In addition, after contact holes are formed in the gate insulating film 63 and the insulating film 69, wirings may be formed so as to be connected to the source electrode 61a and the drain electrode 61b.

The insulating film 69 can be formed as appropriate with an insulating film similar to that of the gate insulating film 63. When a silicon nitride film is formed as the insulating film 69 by a sputtering method, entry of moisture and an alkali metal from the outside can be prevented, and thus the amount of impurities contained in the indium zinc oxide film 59 can be reduced.

Note that after the gate insulating film 63 is formed or the insulating film 69 is formed, heat treatment may be performed. This heat treatment enables release of hydrogen from the indium zinc oxide film 59 and diffusion of part of oxygen contained in base insulating film 53, the gate insulating film 63, or the insulating film 69 into the indium zinc oxide film 59, in the vicinity of the interface between the base insulating film 53 and the indium zinc oxide film 59, and in the vicinity of the interface between the gate insulating film 63 and the indium zinc oxide film 59. Through this process, oxygen vacancies in the indium zinc oxide film 59 can be reduced, and oxygen vacancies at the interface between the indium zinc oxide film 59 and the base insulating film 53 or the interface between the indium zinc oxide film 59 and the gate insulating film 63 can be reduced. As a result, it is possible to form the indium zinc oxide film 59 in which the hydrogen concentration and oxygen vacancies are reduced.

Through the above process, the transistor 120 in which a channel region is formed in the indium zinc oxide film having hexagonal and rhombohedral crystal structures can be formed. As illustrated in FIG. 5E, the transistor 120 includes the base insulating film 53 provided over the substrate 51, the indium zinc oxide film 59 provided over the base insulating film 53, the source electrode 61a and the drain electrode 61b provided in contact with an upper surface and side surfaces of the indium zinc oxide film 59, the gate insulating film 63 provided over the indium zinc oxide film 59, the gate electrode 65 provided over the gate insulating film 63 so as to overlap with the indium zinc oxide film 59, and the insulating film 69 provided over the gate electrode 65.

The indium zinc oxide film used for the transistor 120 includes an oxide semiconductor having hexagonal and rhombohedral crystal structures and has favorable crystallinity compared with an oxide semiconductor film which is entirely amorphous; thus, oxygen vacancies, dangling bonds, or impurities such as hydrogen bonded to dangling bonds or the like are reduced. A defect typified by such an oxygen vacancy, a dangling bond, hydrogen bonded to a dangling bond or the like, or the like functions as a carrier trap or a source for supplying a carrier in the oxide semiconductor film, which might change the electric conductivity of the oxide semiconductor film. Therefore, the indium zinc oxide film having hexagonal and rhombohedral crystal structures in which such defects are reduced has stable electric conductivity and is more electrically stable with respect to irradiation with visible light, ultraviolet light, and the like. By using such an indium zinc oxide film having hexagonal and rhombohedral crystal structures for a transistor, a highly reliable semiconductor device having stable electric characteristics can be provided.

The semiconductor device according to one embodiment of the present invention is not limited to the transistor 120 illustrated in FIGS. 5A to 5E. For example, a structure like a transistor 130 illustrated in FIG. 9A may be employed. The transistor 130 includes the base insulating film 53 provided over the substrate 51, the source electrode 61a and the drain electrode 61b provided over the base insulating film 53, the indium zinc oxide film 59 provided in contact with upper surfaces and side surfaces of the source electrode 61a and the drain electrode 61b, the gate insulating film 63 provided over the indium zinc oxide film 59, the gate electrode 65 provided over the gate insulating film 63 so as to overlap with the indium zinc oxide film 59, and the insulating film 69 provided over the gate electrode 65. That is, the transistor 130 is different from the transistor 120 in that the indium zinc oxide film 59 is provided in contact with the upper surfaces and the side surfaces of the source electrode 61a and the drain electrode 61b.

Figure 9A:
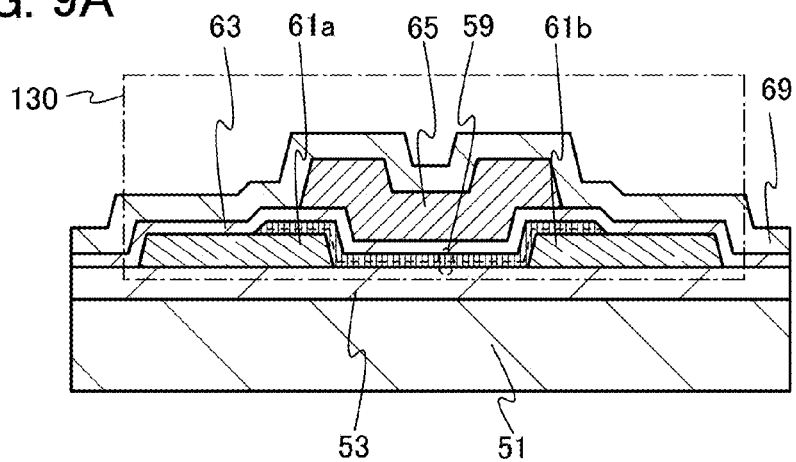
FIGS. 9A to 9C are cross-sectional views each illustrating a semiconductor device according to one embodiment of the present invention.
Figure 9B:
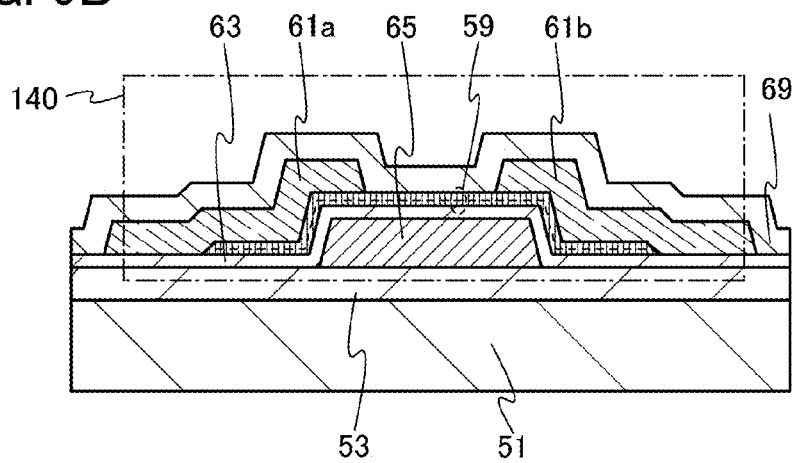

In addition, a structure like a transistor 140 illustrated in FIG. 9B may be employed. The transistor 140 includes the base insulating film 53 provided over the substrate 51, the gate electrode 65 provided over the base insulating film 53, the gate insulating film 63 provided over the gate electrode 65, the indium zinc oxide film 59 provided over the gate insulating film 63, the source electrode 61a and the drain electrode 61b provided in contact with a top surface and side surfaces of the indium zinc oxide film 59, and the insulating film 69 provided over the indium zinc oxide film 59. That is, the transistor 140 is different from the transistor 120 in that it has a bottom gate structure in which the gate electrode 65 and the gate insulating film 63 are provided below the indium zinc oxide film 59.

Figure 9C:
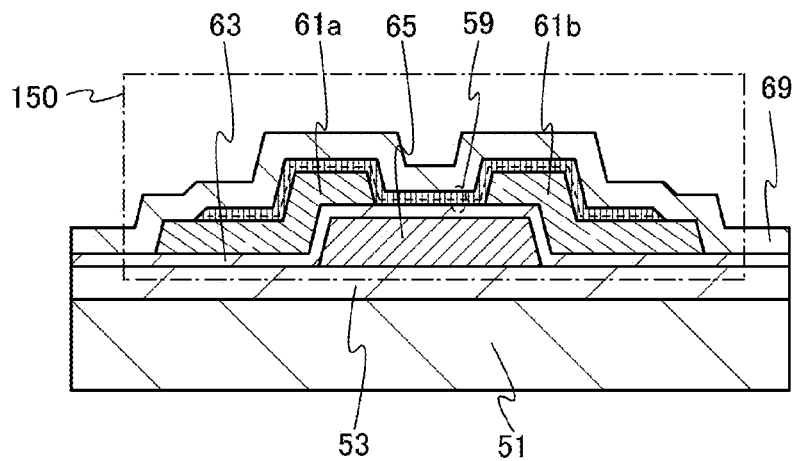

In addition, a structure like a transistor 150 illustrated in FIG. 9C may be employed. The transistor 150 includes the base insulating film 53 provided over the substrate 51, the gate electrode 65 provided over the base insulating film 53, the gate insulating film 63 provided over the gate electrode 65, the source electrode 61a and the drain electrode 61b provided over the gate insulating film 63, the indium zinc oxide film 59 provided in contact with upper surfaces and side surfaces of the source electrode 61a and the drain electrode 61b, and the insulating film 69 provided over the indium zinc oxide film 59. That is, the transistor 150 is different from the transistor 130 in that it has a bottom gate structure in which the gate electrode 65 and the gate insulating film 63 are provided below the indium zinc oxide film 59.

The structures, methods, and the like described in this embodiment can be combined as appropriate with any of the structures, methods, and the like described in other embodiments.

Embodiment 3

In this embodiment, an example in which at least part of a driver circuit and a transistor to be disposed in a pixel portion are formed over one substrate is described below.

The transistor to be disposed in the pixel portion is formed in accordance with Embodiment 2. Further, the transistor can easily be an n-channel transistor; thus, part of a driver circuit that can be formed using an n-channel transistor in the driver circuit is formed over the same substrate as the transistor of the pixel portion. By using the transistor described in the above embodiment for the pixel portion or the driver circuit as described above, a highly reliable display device can be provided.

Figure 10A:
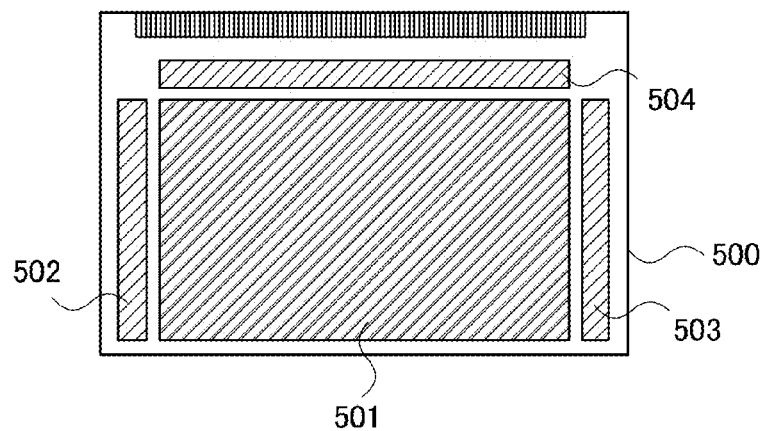
FIGS. 10A to 10C are a block diagram and equivalent circuit diagrams illustrating one embodiment of the present invention.

FIG. 10A is an example of a block diagram of an active matrix display device. A pixel portion 501, a first scan line driver circuit 502, a second scan line driver circuit 503, and a signal line driver circuit 504 are provided over a substrate 500 in the display device. In the pixel portion 501, a plurality of signal lines extended from the signal line driver circuit 504 are arranged and a plurality of scan lines extended from the first scan line driver circuit 502 and the second scan line driver circuit 503 are arranged. Note that pixels which include display elements are provided in a matrix in respective regions where the scan lines and the signal lines intersect with each other. The substrate 500 of the display device is connected to a timing control circuit (also referred to as controller or control IC) through a connection portion such as a flexible printed circuit (FPC).

In FIG. 10A, the first scan line driver circuit 502, the second scan line driver circuit 503, and the signal line driver circuit 504 are formed over the same substrate 500 as the pixel portion 501. Accordingly, the number of components of a driver circuit which is provided outside and the like are reduced, so that reduction in cost can be achieved. Further, when the driver circuit is provided outside the substrate 500, wiring would need to be extended and the number of wiring connections would be increased, but when the driver circuit is provided over the substrate 500, the number of wiring connections can be reduced. Accordingly, the reliability or yield can be improved.

Figure 10B:
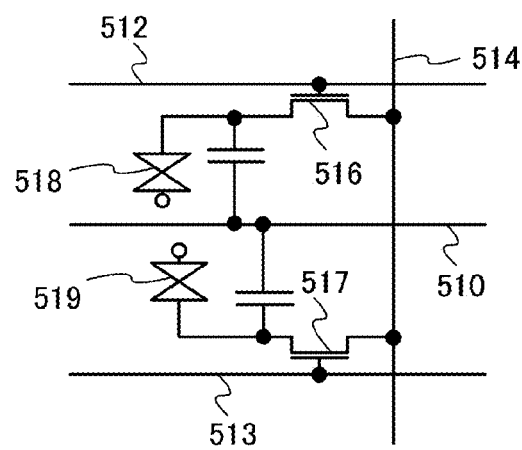

FIG. 10B illustrates an example of a circuit configuration of the pixel portion. Here, a pixel structure of a VA liquid crystal display panel is shown.

In this pixel structure, a plurality of pixel electrode layers are provided in one pixel, and transistors are connected to respective pixel electrode layers. The transistors are driven by different gate signals. In other words, signals applied to individual pixel electrode layers in a multi-domain pixel are controlled independently.

A gate wiring 512 of a transistor 516 and a gate wiring 513 of a transistor 517 are separated so that different gate signals can be given thereto. In contrast, a source or drain electrode layer 514 functioning as a data line is used in common for the transistors 516 and 517. As the transistors 516 and 517, the transistor described in the above embodiment can be used as appropriate. In the above manner, a highly reliable liquid crystal display panel can be provided.

A first pixel electrode layer connected to the transistor 516 and a second pixel electrode layer connected to the transistor 517 have different shapes and are separated by a slit. The second pixel electrode layer is provided so as to surround the external side of the first pixel electrode layer which is spread in a V shape. Timing of voltage application is made to vary between the first and second pixel electrode layers by the transistors 516 and 517 in order to control alignment of the liquid crystal. The transistor 516 is connected to the gate wiring 512, and the transistor 517 is connected to the gate wiring 513. When different gate signals are supplied to the gate wiring 512 and the gate wiring 513, operation timings of the transistor 516 and the transistor 517 can be varied.

Further, a storage capacitor is formed using a capacitor wiring 510, a gate insulating film functioning as a dielectric, and a capacitor electrode connected to the first pixel electrode layer or the second pixel electrode layer.

The first pixel electrode layer, a liquid crystal layer, and a counter electrode layer overlap with one another to form a first liquid crystal element 518. In addition, the second pixel electrode layer, the liquid crystal layer, and the counter electrode layer overlap with one another to form a second liquid crystal element 519. The pixel structure is a multi-domain structure in which the first liquid crystal element 518 and the second liquid crystal element 519 are provided in one pixel.

Note that the pixel structure is not limited to that illustrated in FIG. 10B. For example, a switch, a resistor, a capacitor, a transistor, a sensor, a logic circuit, or the like may be added to the pixel illustrated in FIG. 10B.

Figure 10C:
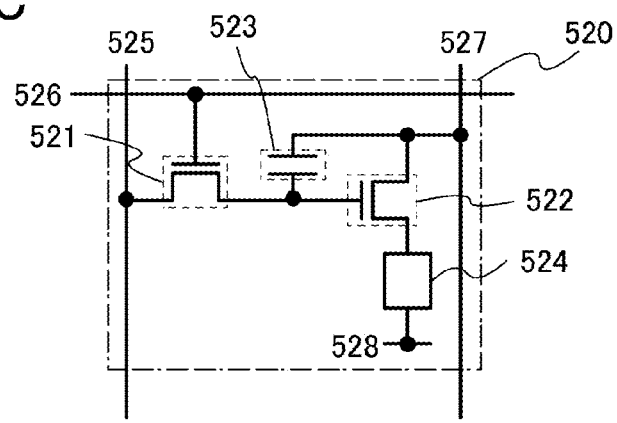

FIG. 10C shows an example of a circuit configuration of the pixel portion. Here, a pixel structure of a display panel using an organic EL element is shown.

In an organic EL element, by application of voltage to a light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound relaxes to a ground state from the excited state, thereby emitting light. Owing to such a mechanism, this light-emitting element is referred to as current-excitation light-emitting element.

The following shows the structure and operation of a pixel by which the organic EL element can be driven. Here, one pixel includes two n-channel transistors each of which includes an indium zinc oxide film for a channel region.

A pixel 520 includes a switching transistor 521, a driving transistor 522, a light-emitting element 524, and a capacitor 523. A gate electrode layer of the switching transistor 521 is connected to a scan line 526, a first electrode (one of a source electrode layer and a drain electrode layer) of the switching transistor 521 is connected to a signal line 525, and a second electrode (the other of the source electrode layer and the drain electrode layer) of the switching transistor 521 is connected to a gate electrode layer of the driving transistor 522. The gate electrode layer of the driving transistor 522 is connected to a power supply line 527 through the capacitor 523, a first electrode of the driving transistor 522 is connected to the power supply line 527, and a second electrode of the driving transistor 522 is connected to a first electrode (pixel electrode) of the light-emitting element 524. A second electrode of the light-emitting element 524 corresponds to a common electrode 528. The common electrode 528 is connected to a common potential line formed over the same substrate as the common electrode 528.

As the switching transistor 521 and the driving transistor 522, the transistor described in Embodiment 2 can be used as appropriate. In this manner, a highly reliable display panel including an organic EL element can be provided.

Note that the second electrode (the common electrode 528) of the light-emitting element 524 is set to have a low power supply potential. Note that the low power supply potential is a potential satisfying the low power supply potential <a high power supply potential with reference to the high power supply potential that is set for the power supply line 527. As the low power supply potential, GND, 0 V, or the like may be employed, for example. In order to make the light-emitting element 524 emit light by applying a potential difference between the high power supply potential and the low power supply potential to the light-emitting element 524 so that current is supplied to the light-emitting element 524, each of the potentials is set so that the potential difference between the high power supply potential and the low power supply potential is higher than or equal to the forward threshold voltage of the light-emitting element 524.

Gate capacitance of the driving transistor 522 may be used as a substitute for the capacitor 523, in which case the capacitor 523 can be omitted. The gate capacitance of the driving transistor 522 may be formed between a channel region and the gate electrode layer.

In the case of performing analog grayscale driving, a voltage of higher than or equal to the sum of the forward voltage of the light-emitting element 524 and $V_{th}$ of the driving transistor 522 is applied to the gate electrode layer of the driving transistor 522. The forward voltage of the light-emitting element 524 indicates a voltage at which a desired luminance is obtained, and includes at least a forward threshold voltage. A video signal by which the driving transistor 522 is operated in a saturation region is input, so that current can be supplied to the light-emitting element 524. In order for the driving transistor 522 to operate in a saturation region, the potential of the power supply line 527 is set to be higher than the gate potential of the driving transistor 522. Since the video signal is an analog signal, a current in accordance with the video signal can be supplied to the light-emitting element 524, and analog grayscale driving can be performed.

Note that the pixel structure is not limited to that illustrated in FIG. 10C. For example, a switch, a resistor, a capacitor, a sensor, a transistor, a logic circuit, or the like may be added to the pixel illustrated in FIG. 10C.

The structures, methods, and the like described in this embodiment can be combined as appropriate with any of the structures, methods, and the like described in other embodiments.

Embodiment 4

A semiconductor device disclosed in this specification can be applied to a variety of electronic appliances (including game machines). Examples of electronic appliances are a television set (also referred to as television or television receiver), a monitor of a computer or the like, a camera such as a digital camera or a digital video camera, a digital photo frame, a mobile phone handset (also referred to as mobile phone or mobile phone device), a portable game machine, a portable information terminal, an audio reproducing device, a large-sized game machine such as a pachinko machine, and the like. Examples of electronic appliances each including the display device described in any of the above embodiments are described.

Figure 11A:
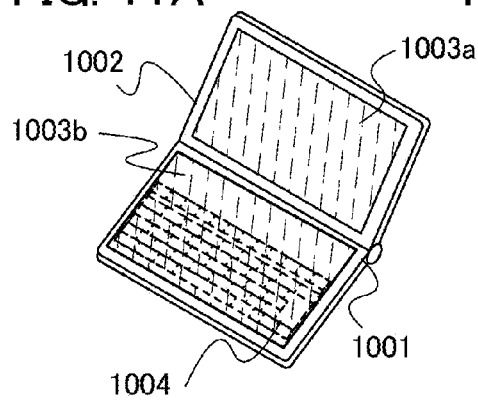
FIGS. 11A to 11D are external views each illustrating an electronic appliance according to one embodiment of the present invention.

FIG. 11A illustrates a portable information terminal including a main body 1001, a housing 1002, display portions 1003a and 1003b, and the like. The display portion 1003b is a touch panel. By touching a keyboard button 1004 displayed on the display portion 1003b, a screen can be operated and text can be input. Needless to say, the display portion 1003a may be a touch panel. A liquid crystal panel or an organic light-emitting panel is manufactured by using the transistor described in the above embodiment as a switching element and applied to the display portion 1003a or 1003b, whereby a highly reliable portable information terminal can be provided.

The portable information terminal illustrated in FIG. 11A can have a function of displaying a variety of kinds of information (e.g., a still image, a moving image, and a text image), a function of displaying a calendar, a date, the time, or the like on the display portion, a function of operating or editing the information displayed on the display portion, a function of controlling processing by a variety of kinds of software (programs), and the like. Furthermore, an external connection terminal (e.g., an earphone terminal or a USB terminal), a recording medium insertion portion, and the like may be provided on the back surface or the side surface of the housing.

The portable information terminal illustrated in FIG. 11A may transmit and receive data wirelessly. Through wireless communication, desired book data or the like can be purchased and downloaded from an electronic book server.

Figure 11B:
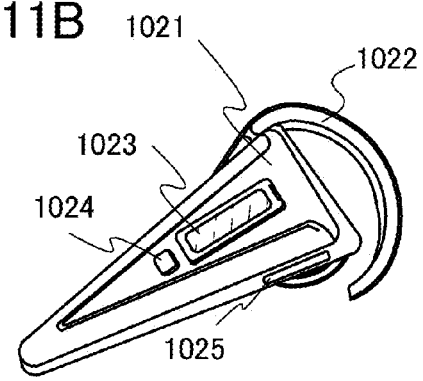

FIG. 11B illustrates a portable music player including, in a main body 1021, a display portion 1023, a fixing portion 1022 with which the portable music player can be worn on the ear, a speaker, an operation button 1024, an external memory slot 1025, and the like. A liquid crystal panel or an organic light-emitting panel is manufactured by using the transistor described in the above embodiment as a switching element and applied to the display portion 1023, whereby a highly reliable portable music player can be provided.

Furthermore, when the portable music player illustrated in FIG. 11B has an antenna, a microphone function, or a wireless communication function and is used with a mobile phone, a user can talk on the phone wirelessly in a hands-free way while driving a car or the like.

Figure 11C:
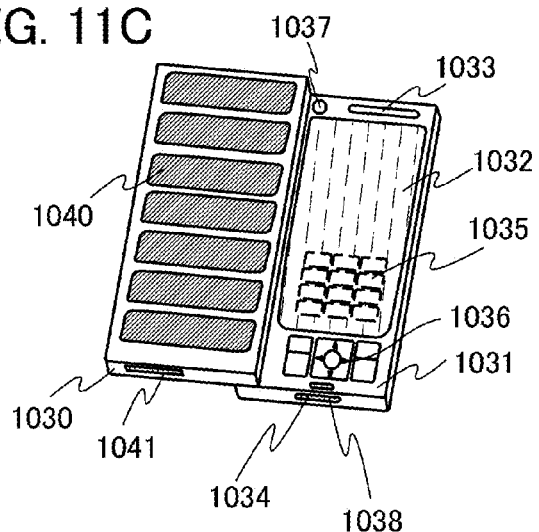

FIG. 11C illustrates a mobile phone including two housings, a housing 1030 and a housing 1031. The housing 1031 includes a display panel 1032, a speaker 1033, a microphone 1034, a pointing device 1036, a camera lens 1037, an external connection terminal 1038, and the like. The housing 1030 is provided with a solar cell 1040 for charging the mobile phone, an external memory slot 1041, and the like. In addition, an antenna is incorporated in the housing 1031. The transistor described in the above embodiment is applied to the display panel 1032, whereby a highly reliable mobile phone can be provided.

Further, the display panel 1032 includes a touch panel. A plurality of operation keys 1035 which are displayed as images are indicated by dotted lines in FIG. 11C. Note that a boosting circuit by which a voltage output from the solar cell 1040 is increased to be sufficiently high for each circuit is also included.

For example, a power transistor used for a power supply circuit such as a boosting circuit can also be formed when the oxide semiconductor film of the transistor described in the above embodiment has a thickness of greater than or equal to 2 μm and less than or equal to 50 μm.

In the display panel 1032, the direction of display is changed as appropriate depending on the application mode. Further, the mobile phone is provided with the camera lens 1037 on the same surface as the display panel 1032, and thus it can be used as a video phone. The speaker 1033 and the microphone 1034 can be used for videophone calls, recording, and playing sound, and the like as well as voice calls. Moreover, the housings 1030 and 1031 in a state where they are developed as illustrated in FIG. 11C can shift, by sliding, to a state where one overlaps with the other. Therefore, the size of the mobile phone can be reduced, which makes the mobile phone suitable for being carried around.

The external connection terminal 1038 can be connected to an AC adaptor and a variety of cables such as a USB cable, whereby charging and data communication with a personal computer or the like are possible. Further, by inserting a recording medium into the external memory slot 1041, a larger amount of data can be stored and moved.

Further, in addition to the above functions, an infrared communication function, a television reception function, or the like may be provided.

Figure 11D:
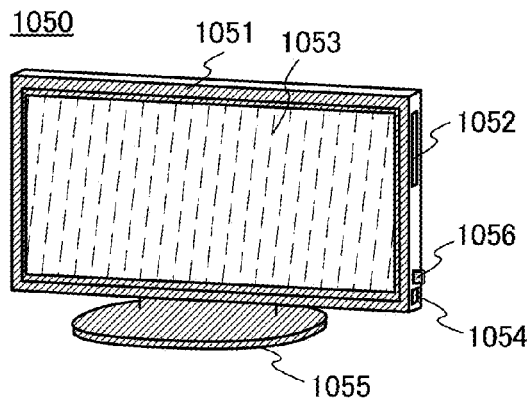

FIG. 11D illustrates an example of a television set. In a television set 1050, a display portion 1053 is incorporated in a housing 1051. Images can be displayed on the display portion 1053. Here, the housing 1051 is supported on a stand 1055 incorporating a CPU. The transistor described in the above embodiment is applied to the display portion 1053, whereby the highly reliable television set 1050 can be provided.

The television set 1050 can be operated with an operation switch of the housing 1051 or a separate remote controller. Further, the remote controller may be provided with a display portion for displaying data output from the remote controller.

Note that the television set 1050 is provided with a receiver, a modem, and the like. A general television broadcast can be received with the receiver. Moreover, when the display device is connected to a communication network with or without wires via the modem, one-way (from a sender to a receiver) or two-way (between a sender and a receiver or between receivers) information communication can be performed.

Further, the television set 1050 is provided with an external connection terminal 1054, a storage medium recording and reproducing portion 1052, and an external memory slot. The external connection terminal 1054 can be connected to various types of cables such as a USB cable, and data communication with a personal computer or the like is possible. A disk storage medium is inserted into the storage medium recording and reproducing portion 1052, data stored in the storage medium can be read, and data can be written to the storage medium. In addition, an image, a video, or the like stored as data in an external memory 1056 inserted into the external memory slot can be displayed on the display portion 1053.

The structures, methods, and the like described in this embodiment can be combined as appropriate with any of the structures, methods, and the like described in other embodiments.

This application is based on Japanese Patent Application serial no. 2011-068436 filed with Japan Patent Office on Mar. 25, 2011, the entire contents of which are hereby incorporated by reference.

What is claimed is:

1. An oxide semiconductor film comprising indium zinc oxide, the oxide semiconductor film comprising:
   a hexagonal crystal structure in which an a-b plane is substantially parallel to a surface of the oxide semiconductor film; and
   a rhombohedral crystal structure in which an a-b plane is substantially parallel to the surface of the oxide semiconductor film.

2. The oxide semiconductor film according to claim 1, wherein the oxide semiconductor film comprises a plurality of regions each of which comprises the hexagonal crystal structure and the rhombohedral crystal structure.

3. The oxide semiconductor film according to claim 1, wherein, in the oxide semiconductor film, a concentration of alkali metal is lower than or equal to $5 \times 10^{16}$ atoms/cm$^3$.

4. The oxide semiconductor film according to claim 1, wherein, in the oxide semiconductor film, a concentration of hydrogen is lower than or equal to $5 \times 10^{19}$ atom/cm$^3$.

5. The oxide semiconductor film according to claim 1, wherein the hexagonal crystal structure is a crystal structure of an oxide semiconductor having a composition ratio of In:Zn=1:1, and
   wherein the rhombohedral crystal structure is a crystal structure of an oxide semiconductor having a composition ratio of In:Zn=2:1.

6. The oxide semiconductor film according to claim 5, wherein the oxide semiconductor film comprises a plurality of regions each of which comprises the hexagonal crystal structure and the rhombohedral crystal structure.

7. A semiconductor device comprising:
   a gate electrode;
   an oxide semiconductor film comprising of indium zinc oxide;
   a first insulating film provided between the gate electrode and the oxide semiconductor film;
   a source electrode and a drain electrode provided in contact with the oxide semiconductor film; and
   a second insulating film provided over the oxide semiconductor film,
   wherein the oxide semiconductor film includes a hexagonal crystal structure in which an a-b plane is substantially parallel to a surface of the oxide semiconductor film and a rhombohedral crystal structure in which an a-b plane is substantially parallel to the surface of the oxide semiconductor film.

8. The semiconductor device according to claim 7, wherein the oxide semiconductor film comprises a plurality of regions each of which comprises the hexagonal crystal structure and the rhombohedral crystal structure.

9. The semiconductor device according to claim 7, wherein the gate electrode is provided over the oxide semiconductor film, and
   wherein the source electrode and the drain electrode is provided over the oxide semiconductor film.

10. The semiconductor device according to claim 9, wherein the gate electrode overlaps with a part of the source electrode and a part of the drain electrode.

11. The semiconductor device according to claim 7, wherein the gate electrode is provided over the oxide semiconductor film, and wherein the source electrode and the drain electrode is provided under the oxide semiconductor film.

12. The semiconductor device according to claim 7, wherein the gate electrode is provided under the oxide semiconductor film, and
wherein the source electrode and the drain electrode is provided over the oxide semiconductor film.

13. The semiconductor device according to claim 7, wherein the gate electrode is provided under the oxide semiconductor film, and
wherein the source electrode and the drain electrode is provided under the oxide semiconductor film.

14. The semiconductor device according to claim 7, wherein, in the oxide semiconductor film, a concentration of alkali metal is lower than or equal to $5\times10^{16}$ atoms/cm$^3$.

15. The semiconductor device according to claim 7, wherein, in the oxide semiconductor film, a concentration of hydrogen is lower than or equal to $5\times10^{19}$ atom/cm$^3$.

16. The semiconductor device according to claim 7, wherein the hexagonal crystal structure is a crystal structure of an oxide semiconductor having a composition ratio of In:Zn=1:1, and
wherein the rhombohedral crystal structure is a crystal structure of an oxide semiconductor having a composition ratio of In:Zn=2:1.

17. The semiconductor device according to claim 16, wherein the oxide semiconductor film comprises a plurality of regions each of which comprises the hexagonal crystal structure and the rhombohedral crystal structure.

* * * * *

UNITED STATES PATENT AND TRADEMARK OFFICE
CERTIFICATE OF CORRECTION

PATENT NO.         : 8,835,921 B2                                    Page 1 of 1
APPLICATION NO.    : 14/191714
DATED              : September 16, 2014
INVENTOR(S)        : Tatsuya Honda et al.

It is certified that error appears in the above-identified patent and that said Letters Patent is hereby corrected as shown below:

In the Specification

At column 6, line 26, "of "1" which" should be --of "l" which--;

At column 6, line 32, "of "1" which" should be --of "l" which--.

Signed and Sealed this
Seventh Day of April, 2015

Michelle K. Lee
*Director of the United States Patent and Trademark Office*